(12) United States Patent
Myoung et al.

(10) Patent No.: US 11,569,446 B2
(45) Date of Patent: Jan. 31, 2023

(54) MICROSTRUCTURES ARRAY AND METHOD OF MANUFACTURING THE SAME AND MICRO LIGHT EMITTING DIODE AND METHOD OF MANUFACTURING THE SAME AND DISPLAY DEVICE

(71) Applicant: YONSEI UNIVERSITY, UNIVERSITY—INDUSTRY FOUNDATION, Seoul (KR)

(72) Inventors: Jae-Min Myoung, Goyang-si (KR); Yun Cheol Kim, Seoul (KR); Hee Ju An, Seoul (KR); Do Hoon Kim, Paju-si (KR)

(73) Assignee: YONSEI UNIVERSITY, UNIVERSITY—INDUSTRY FOUNDATION (UIF), Seoul (KR)

( * ) Notice: Subject to any disclaimer, the term of this patent is extended or adjusted under 35 U.S.C. 154(b) by 259 days.

(21) Appl. No.: 16/999,284

(22) Filed: Aug. 21, 2020

(65) Prior Publication Data

US 2021/0159415 A1 May 27, 2021

(30) Foreign Application Priority Data

Nov. 27, 2019 (KR) .................. 10-2019-0154697

(51) Int. Cl.
*H01L 33/00* (2010.01)
*H01L 51/00* (2006.01)
(Continued)

(52) U.S. Cl.
CPC ........ *H01L 51/0014* (2013.01); *H01L 25/048* (2013.01); *H01L 51/004* (2013.01);
(Continued)

(58) Field of Classification Search
CPC .................... H01L 33/005; H01L 33/0083
See application file for complete search history.

(56) References Cited

U.S. PATENT DOCUMENTS 10,276,807 B2    4/2019 Lee et al.
2018/0298278 A1  10/2018 Zhong et al.
(Continued)

FOREIGN PATENT DOCUMENTS

KR        101724210      3/2017
KR     1020190004413 A   1/2019

OTHER PUBLICATIONS

Hao Xiong, et al., Modifying Perovskite Films with Polyvinylpyrrolidone for Ambient-Air-Stable Highly Bendable Solar Cells, ACS Appl. Mater. Interfaces 2018, 10, 41, 35385-35394.
(Continued)

*Primary Examiner* — Jae Lee
(74) *Attorney, Agent, or Firm* — Cantor Colburn LLP

(57) ABSTRACT

Disclosed are a method of manufacturing a microstructure array that includes preparing a mold having a concave micro pattern array in which a plurality of concave micro patterns are arranged, preparing a perovskite precursor solution including a perovskite precursor and a hydrophilic polymer, coating the perovskite precursor solution on a substrate, disposing the mold on the perovskite precursor solution to confine the perovskite precursor solution in the plurality of concave micro patterns, obtaining a composite of perovskite nanocrystals and the hydrophilic polymer from the perovskite precursor solution in the plurality of concave micro patterns, and, and removing the mold to form a microstructure array in which a plurality of microstructures including a composite of the perovskite nanocrystals and the hydrophilic polymer are arranged, a microstructure array, a micro light emitting diode including the same, and a manufacturing method thereof, and a display device.

16 Claims, 48 Drawing Sheets

(51) Int. Cl.
*H01L 25/04* (2014.01)
*H01L 51/50* (2006.01)

(52) U.S. Cl.
CPC ...... *H01L 51/0035* (2013.01); *H01L 51/0037* (2013.01); *H01L 51/0077* (2013.01); *H01L 51/003* (2013.01); *H01L 51/0026* (2013.01); *H01L 51/502* (2013.01)

(56) References Cited

U.S. PATENT DOCUMENTS

| | | | |
|---|---|---|---|
| 2019/0259962 A1 | 8/2019 | Tae-Woo et al. | |
| 2020/0075816 A1* | 3/2020 | Cheng | H01L 25/0753 |
| 2021/0308934 A1* | 10/2021 | Zakhidov | B29C 59/022 |
| 2022/0278165 A1* | 9/2022 | Wang | H01L 33/10 |

OTHER PUBLICATIONS

Machteld E. Kamminga, et al., ACS Applied Materials & Interfaces, Just Accepted Manuscript • DOI: 10.1021/acsami.8b02236 • Publication Date (Web): Mar. 26, 2018 2018,10, 12878-12885.
Paris G. Papagiorgis, et. el., Robust Hydrophobic and Hydrophilic Polymer Fibers Sensitized by Inorganic and Hybrid Lead Halide Perovskite Nanocrystal Emitters, Frontiers in Chemistry, Feb. 2019 | vol. 7 | Article 87, 12 pp.

* cited by examiner

FIG. 26
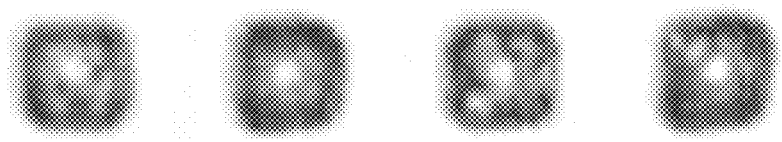
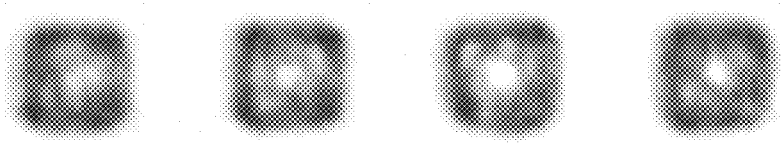
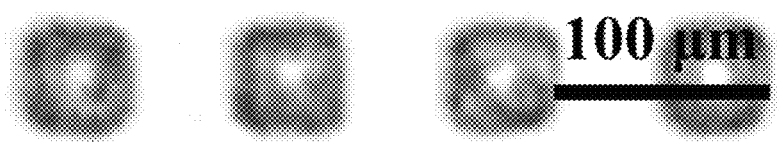

Circle

Octagon

MICROSTRUCTURES ARRAY AND METHOD OF MANUFACTURING THE SAME AND MICRO LIGHT EMITTING DIODE AND METHOD OF MANUFACTURING THE SAME AND DISPLAY DEVICE

CROSS-REFERENCE TO RELATED APPLICATION

This application claims priority to and the benefit of Korean Patent Application No. 10-2019-0154697 filed in the Korean Intellectual Property Office on Nov. 27, 2019, the entire contents of which are incorporated herein by reference.

BACKGROUND OF THE INVENTION

(a) Field of the Invention

A microstructure array, a method of manufacturing the same, a micro light emitting diode, a method of manufacturing the same, and a display device are disclosed.

(b) Description of the Related Art

Recently, according to a trend toward lighter weight and thinner thickness of a display device, research on light emitting devices using self-light emitters such as organic light emitting diodes or quantum dot light emitting diodes has been conducted.

Perovskite is one of the self-light emitters that emit light on its own, and are attracting attention as a key material for next-generation light emitting devices based on high color purity and good light-emitting characteristics.

SUMMARY OF THE INVENTION

An embodiment provides a microstructure array capable of exhibiting improved performance in a simple process.

Another embodiment provides a method of manufacturing the microstructure array.

Another embodiment provides a micro light emitting diode including the microstructure array.

Another embodiment provides a method of manufacturing the micro light emitting diode.

Another embodiment provides a display device including the microstructure array or the micro light emitting diode.

According to an embodiment, a method of manufacturing a microstructure array includes preparing a mold having a concave micro pattern array in which a plurality of concave micro patterns are arranged, preparing a perovskite precursor solution including a perovskite precursor and a hydrophilic polymer, coating the perovskite precursor solution on a substrate, disposing the mold on the perovskite precursor solution to confine the perovskite precursor solution in the plurality of concave micro patterns, obtaining a composite of perovskite nanocrystals and the hydrophilic polymer from the perovskite precursor solution in the plurality of concave micro patterns, and removing the mold to form a microstructure array in which a plurality of microstructures including the composite of the perovskite nanocrystals and the hydrophilic polymer are arranged.

The hydrophilic polymer may include polyvinylpyrrolidone, polyethyleneamine, polyacrylamide, poly(meth)acrylate, polyvinyl alcohol, polyethylene glycol, polyethyleneoxide, polyoxazoline, a derivative thereof, or a copolymer thereof.

The perovskite precursor solution may further include a ligand.

The ligand may be represented by RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RPOOH, RHPOOH, or $R_2POOH$ (wherein, R is independently a substituted or unsubstituted C1 to C40 aliphatic hydrocarbon, a substituted or unsubstituted C6 to C40 aromatic hydrocarbon, or a combination thereof).

The obtaining of the composite of the perovskite nanocrystals and the hydrophilic polymer may include heat treatment.

The heat treatment may be performed at a temperature of about 50° C. to about 200° C.

A dimension of the microstructure may be equal to or smaller than a dimension of the concave micro pattern of the mold.

A width and a length of the microstructure may be less than or equal to about 80 μm, respectively.

According to another embodiment, a method of manufacturing a micro light emitting diode includes forming a first electrode, forming a microstructure array on the first electrode, and forming a second electrode on the microstructure array, wherein the forming of the microstructure array includes forming a first microstructure array in which a plurality of first microstructures including first perovskite nanocrystals configured to emit light in a first wavelength region are arranged, forming a second microstructure array in which a plurality of second microstructures including second perovskite nanocrystals configured to emit light in a second wavelength region are arranged, and forming a third microstructure array in which a plurality of third microstructures including third perovskite nanocrystals configured to emit light in a third wavelength region are arranged, and at least one of forming processes of the first, second, and third microstructure arrays is performed by the manufacturing method of the microstructures.

According to another embodiment, provided is a microstructure array in which a plurality of microstructures including a composite of perovskite nanocrystals and the hydrophilic polymer are arranged.

The hydrophilic polymer may include polyvinylpyrrolidone, polyethyleneamine, polyacrylamide, poly(meth)acrylate, polyvinyl alcohol, polyethylene glycol, polyethyleneoxide, polyoxazoline, a derivative thereof, or a copolymer thereof.

The composite may further include a ligand bound to the surface of the perovskite nanocrystals.

The ligand may be derived from RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RPOOH, RHPOOH or $R_2POOH$ (wherein R is independently a substituted or unsubstituted C1 to C40 aliphatic hydrocarbon, a substituted or unsubstituted C6 to C40 aromatic hydrocarbon, or a combination thereof).

An average crystal dimension of the perovskite nanocrystals may be less than or equal to about 200 nm.

A width and a length of the microstructure may be less than or equal to about 80 μm, respectively.

According to another embodiment, a micro light emitting diode includes a first electrode and a second electrode facing each other, and the microstructure array between the first electrode and the second electrode.

The microstructure array may include a first microstructure array in which a plurality of first microstructures including a composite of first perovskite nanocrystals and a hydrophilic polymer are arranged, a second microstructure array in which a plurality of second microstructures including a composite of second perovskite nanocrystals and a hydrophilic polymer are arranged, and a third microstructure array in which a plurality of third microstructures including a composite of third perovskite nanocrystals a hydrophilic polymer are arranged, wherein the first perovskite is configured to emit light in a first wavelength region, the second perovskite is configured to emit light in a second wavelength region different from the first wavelength region, the third perovskite is configured to emit light in a third wavelength region different from the first wavelength region and the second wavelength region, and the first microstructures, the second microstructures, and the third microstructures may be disposed adjacently.

The micro light emitting diode may include first, second, and third subpixels displaying different colors each other, wherein the first subpixel may include the first microstructure, and the second subpixel may include the second microstructure, and the third subpixel may include the third microstructure.

The micro light emitting diode may further include a charge auxiliary layer between at least one of the first electrode and the microstructure array and between the second electrode and the microstructure array.

According to another embodiment, a display device including the micro light emitting diode is provided.

A microstructure array and a micro light emitting diode capable of exhibiting improved performance in a simple process are provided.

BRIEF DESCRIPTION OF THE DRAWINGS

FIG. 26 is a photograph of a microstructure array according to Example 9.

DETAILED DESCRIPTION OF THE EMBODIMENTS

Figure 1:
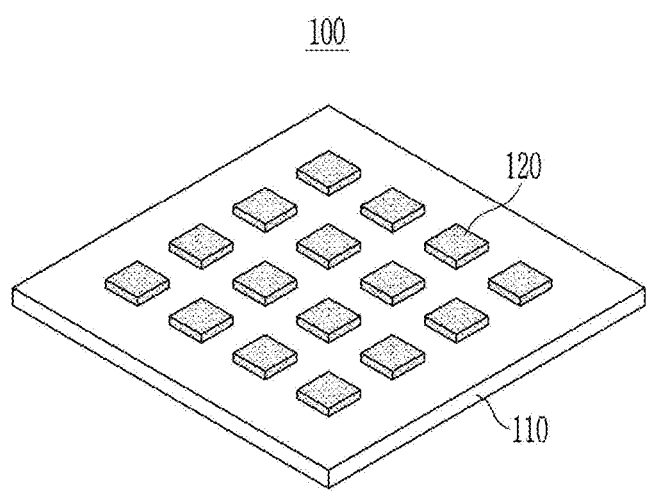
FIG. 1 is a schematic view showing an example of a microstructure array according to an embodiment.

Hereinafter, the embodiments will be described in detail so that those skilled in the art can easily implement them. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, 'substituted' refers to replacement of hydrogen of a compound by a substituent selected from halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, "combination" includes a mixture and a stacked structure of two or more.

Hereinafter, a width and a length are dimensions extending in different directions (for example, a vertical direction) in the same plane, and a thickness, a depth, or a height is a dimension extending in each vertical direction with respect to the width and length. For example, in the case of a structure formed on a substrate, the dimensions extending in an in-plane direction (x and y directions) of the substrate may be a width and a length, respectively, and the dimensions extending in the thickness direction (z direction) of the substrate may be a thickness, a depth, or a height.

Hereinafter, a microstructure array according to an embodiment is described with reference to the drawings.

Figure 2:
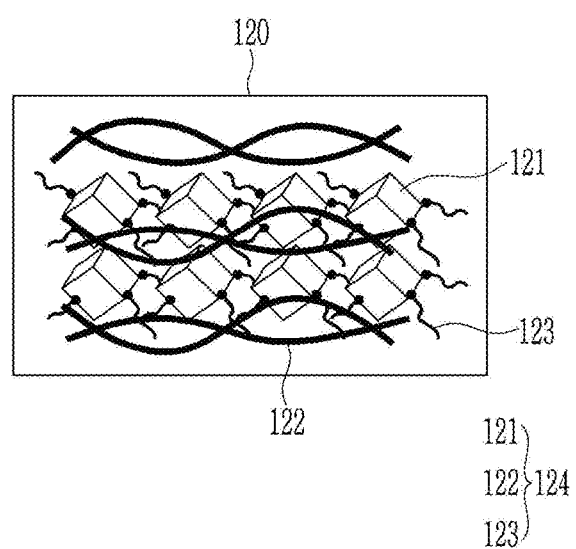
FIG. 2 is a schematic view showing an example of a composite included in a microstructure.

FIG. 1 is a schematic view showing an example of a microstructure array according to an embodiment, and FIG. 2 is a schematic view showing an example of a composite included in a microstructure.

Referring to FIG. 1, the microstructure array 100 according to an embodiment includes a substrate 110 and a plurality of microstructures 120 arranged randomly or in a predetermined direction on the substrate 110. The plurality of microstructures 120 may be arranged, for example, along rows and/or columns.

The microstructures 120 may be an island-shaped light emitter having a dimension of several to several tens of micrometers. The microstructures 120 may have a polygonal such as a square, rectangular, hexagonal, or octagonal shape, circular, or elliptical planar shape, but are not limited thereto. Herein, the dimension may be a width and/or a length. When the planar shape of the microstructure 120 is circular or elliptical, the width may be a diameter or a long diameter.

For example, the dimension of the microstructure 120 may be less than about 100 µm, within the range, less than or equal to about 80 µm, about 70 µm, less than or equal to about 60 µm, less than or equal to about 50 µm, less than or equal to about 40 µm, less than or equal to about 30 µm, less than or equal to about 20 µm, less than or equal to about 15 µm, less than or equal to about 10 µm, or less than or equal to about 7 µm, or within the range, about 1 µm to about 80 µm, about 1 µm to about 70 µm, about 1 µm to about 60 µm, about 1 µm to about 50 µm, about 1 µm to about 40 µm, about 1 µm to about 30 µm, about 1 µm to about 20 µm, about 1 µm to about 15 µm, about 1 µm to about 10 µm, or about 1 µm to about 7 µm.

For example, the microstructure 120 may be an island-shaped light emitter having a width and a length of less than or equal to about 80 µm. For example, the microstructure 120 may be an island-shaped light emitter having a width and a length of less than or equal to about 50 µm. For example, the microstructure 120 may be an island-shaped light emitter having a width and a length of less than or equal to about 30 µm. For example, the microstructure 120 may be an island-shaped light emitter having a width and a length of less than or equal to about 20 µm. For example, the microstructure 120 may be an island-shaped light emitter having a width and a length of less than or equal to about 10 µm.

The microstructure 120 may be configured to emit light in a predetermined wavelength region among visible wavelength regions, and may be configured to emit light in any one of a red wavelength region, a green wavelength region, and a blue wavelength region.

Referring to FIG. 2, the microstructure 120 include a composite 124 of perovskite nanocrystals 121 and a hydrophilic polymer 122. The composite 124 may further include ligands 123 that are selectively bound or coordinated to the surface of the perovskite nanocrystals 121. The composite 124 may be obtained from a mixture of perovskite precursors, hydrophilic polymer, and optionally ligands, as described later.

The perovskite nanocrystals 121 is a semiconductor crystal capable of emitting light in the visible wavelength region, and may be configured to emit light in any one of a red wavelength region, a green wavelength region, and a blue wavelength region.

The perovskite nanocrystals 121 may have a crystal dimension of sub-micrometer. For example, the average crystal dimension of the perovskite nanocrystals may be less than or equal to about 800 nm, less than or equal to about 600 nm, less than or equal to about 500 nm, less than or equal to about 300 nm, less than or equal to about 200 nm, less than or equal to about 150 nm, less than or equal to about 100 nm, less than or equal to about 80 nm, or less than or equal to about 50 nm, within the range, about 2 nm to about 800 nm, about 2 nm to about 600 nm, about 2 nm to about 500 nm, about 2 nm to about 300 nm, about 2 nm to about 200 nm, about 2 nm to about 150 nm, about 2 nm to about 100 nm, about 2 nm to about 80 nm, or about 2 nm to about 50 nm. Defects in the crystal may be effectively reduced due to the crystal dimension of the sub-micrometer to prevent a decrease in luminous efficiency at room temperature.

The perovskite nanocrystals 121 may have a relatively uniform crystal dimension. For example, the deviation of the crystal dimension of the perovskite nanocrystals is less than or equal to about 50%, less than or equal to about 40%, less than or equal to about 30%, less than or equal to about 20%, or less than or equal to about 10% of the average crystal dimension.

The perovskite nanocrystals 121 may have a crystal structure including cations and anions, for example, a layered structure or a non-layered structure. The perovskite nanocrystals 121 may have a crystal structure represented by, for example, $ABX_3$, $A_2BX_4$, $ABX_4$, $A_{n-1}B_nX_{3n+1}$, or $L_2A_{n-1}B_nX_{3n+1}$ (0<n≤1), but is not limited thereto. Herein, A may be a monovalent inorganic cation such as $Li^+$, $Na^+$, $K^+$, $Rb^+$, and $Cs^+$, a monovalent organic cation such as an organic ammonium cation and an organic amino cation; or a combination thereof, and B may be a metal cation including a transition metal such as $Pb^{2+}$, $Sn^{2+}$, $Ge^{2+}$, $Ga^{2+}$, $In^{2+}$, $Al^{2+}$, $Sb^{2+}$, $Bi^{2+}$, and $Po^{2+}$, a rare earth metal, an alkaline earth metal or a combination thereof, X may be an oxygen ion or a halide anion such as $F^-$, $Cl^-$, $Br^-$, or $I^-$, and L may be an aliphatic or aromatic ammonium cation or an aliphatic or aromatic amino cation which is different from A. The organic ammonium cation or organic amino cation may be, for example, methylammonium, formamidinium, or phenylammonium, but is not limited thereto. The aliphatic or aromatic ammonium cation or the aliphatic or aromatic amino cation may be, for example, n-butyl ammonium, 2-phenylmethyl ammonium, or 2-phenylethyl ammonium, but is not limited thereto.

For example, the perovskite nanocrystals 121 may be halide perovskite nanocrystals including halide anions.

For example, the perovskite nanocrystals 121 may be organic-inorganic hybrid perovskite nanocrystals including organic cations and metal cations.

For example, the perovskite nanocrystals 121 may be $CH_3NH_3PbBr_3$, $CH_3NH_3PbI_3$, $CH_3NH_3SnBr_3$, $CH_3NH_3SnI_3$, $CH_3NH_3Sn_{1-x}Pb_xBr_3$, $CH_3NH_3Sn_{1-x}Pb_xI_3$, $HC(NH_2)_2PbI_3$, $HC(NH_2)_2SnI_3$, $(C_4H_9NH_3)_2PbBr_4$, $(C_6H_5CH_2NH_3)_2PbBr_4$, $(C_6H_5CH_2NH_3)_2PbI_4$, $(C_6H_5C_2H_4NH_3)_2PbBr_4$, $(C_6H_{13}NH_3)_2(CH_3NH_3)_{n-1}Pb_nI_{3n+1}$, or a combination thereof, but are not limited thereto.

The hydrophilic polymer 122 may surround the perovskite nanocrystals 121 and may be a chain-type or cross-linked polymer. The hydrophilic polymer 122 may reduce surface energy between the perovskite precursor solution and the substrate 110 in the process of forming the microstructures 120, as described below, so that wettability of the perovskite precursor solution for the substrate 110 may be increased and thus microstructures having desired shapes and dimensions according to a concave micro pattern of a mold may be formed. In addition, the hydrophilic polymer 122 may prevent deterioration due to oxygen and/or moisture by reducing exposure of the perovskite nanocrystals 121 to oxygen and/or moisture in the air in the microstructures 120.

The hydrophilic polymer 122 may be, for example, polyvinylpyrrolidone (PVP), polyethyleneamine (PEA), polyetherimide (PEI), polyacrylamide (PAM), poly(meth)acrylate, polyvinyl alcohol (PVA), polyethylene glycol, polyethylene oxide, polyoxazoline, derivatives thereof, or copolymers thereof, but is not limited thereto.

The hydrophilic polymer 122 may be included, for example, in the same amount as the perovskite nanocrystals 121 or less amount than the perovskite nanocrystals 121. For example, the hydrophilic polymer 122 may be included in an amount of about 0.1 to 100 parts by weight, within the range, about 1 to 80 parts by weight, about 1 to 50 parts by weight, about 1 to 30 parts by weight, or 1 to 20 parts by weight based on 100 parts by weight of the perovskite nanocrystals 121.

The ligand 123 may be bound or coordinated to the surface of the perovskite nanocrystals 121. The ligand 123 may be, for example, an organic ligand and may be derived from, for example, aliphatic hydrocarbons and/or aromatic hydrocarbons. The ligand may be for example derived from $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR$, $RPO(OH)_2$, $RPOOH$, $RHPOOH$, or $R_2POOH$ (wherein, R is independently a substituted or unsubstituted C1 to C40 aliphatic hydrocarbon, a substituted or unsubstituted C6 to C40 aromatic hydrocarbon, or a combination thereof). The ligand may be, for example, derived from methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine, oleyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, a substituted or unsubstituted octylphosphine (e.g., trioctylphosphine (TOP)), and the like; phosphine oxide such as a substituted or unsubstituted methyl phosphine oxide (e.g., trimethyl phosphine oxide, methyldiphenyl phosphineoxide, etc.), a substituted or unsubstituted ethyl phosphine oxide (e.g., triethyl phosphine oxide, ethyldiphenyl phosphineoxide, etc.), a substituted or unsubstituted propyl phosphine oxide, a substituted or unsubstituted butyl phosphine oxide, a substituted or unsubstituted octylphosphine oxide (e.g., trioctylphosphine oxide (TOPO), and the like; a diphenyl phosphine, triphenyl phosphine compound or an oxide compound thereof; C2 to C40 phosphonic acid; C2 to C40 phosphinic acid, and the like, but is not limited thereto.

The ligand 123 may effectively control a crystal growth from the perovskite precursor in the process of forming the microstructures 120, as described below, so that the perovskite nanocrystals 121 may grow relatively uniformly to have a crystal dimension of the submicrometer.

Hereinafter, a method of manufacturing the microstructure array 100 according to an embodiment is described with reference to the drawings.

FIGS. 3 to 9 are schematic views showing examples of a method of manufacturing a microstructure array according to an embodiment.

Figure 3:
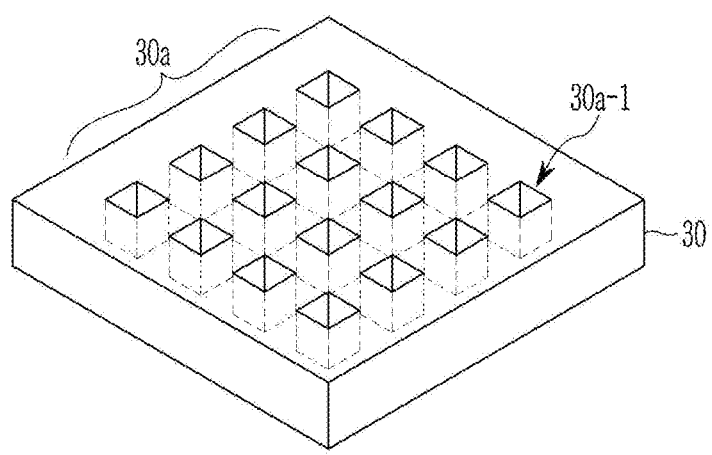
FIG. 3, FIG. 4A, FIG. 4B, FIG. 4C, FIG. 5, FIG. 6, FIG. 7, FIG. 8 and FIG. 9 are schematic views showing examples of a method of manufacturing a microstructure array according to an embodiment.

First, referring to FIG. 3, a patterned mold 30 for forming the microstructure array 100 is prepared. The patterned mold 30 includes a concave micro pattern array 30a in which a plurality of concave micro patterns 30a-1 are arranged in a predetermined direction or randomly arranged. The concave micro pattern 30a-1 may have empty spaces therein, and the empty spaces may be regions in which the perovskite precursor solution, which will be described later, is confined and thus the microstructures 120 are formed. The shape and dimension of the concave micro pattern 30a-1 may be determined according to the microstructure 120 to be formed, for example, the shape and dimension of the concave micro pattern 30a-1 may be designed to be substantially the same in shape and dimension of the microstructure 120 to be formed. For example, the planar shape of the concave micro pattern 30a-1 may be a polygonal shape such as a square, rectangular, hexagonal, or octagonal shape, a circular shape, or an elliptical shape, but is not limited thereto. For example, the dimension of the concave micro pattern 30a-1 may be less than about 100 μm, within the range, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 15 μm, less than or equal to about 10 μm, or less than or equal to about 7 μm, within the range, about 1 μm to about 80 μm, about 1 μm to about 70 μm, about 1 μm to about 60 μm, about 1 μm to about 50 μm, about 1 μm to about 40 μm, about 1 μm to about 30 μm, about 1 μm to about 20 μm, about 1 μm to about 15 μm, about 1 μm to about 10 μm, or about 1 μm to about 7 μm. Herein, the dimension may be a width and/or a length in the planar shape.

A depth of the concave micro pattern 30a-1 may be shallower than a thickness of the mold 30. The depth of the concave micro pattern 30a-1 may be, for example, about 0.1 to 0.9 times, about 0.1 to 0.7 times, or about 0.1 to 0.5 times as deep as the thickness of the concave micro pattern 30a-1, but is not limited thereto.

Figure 4A:
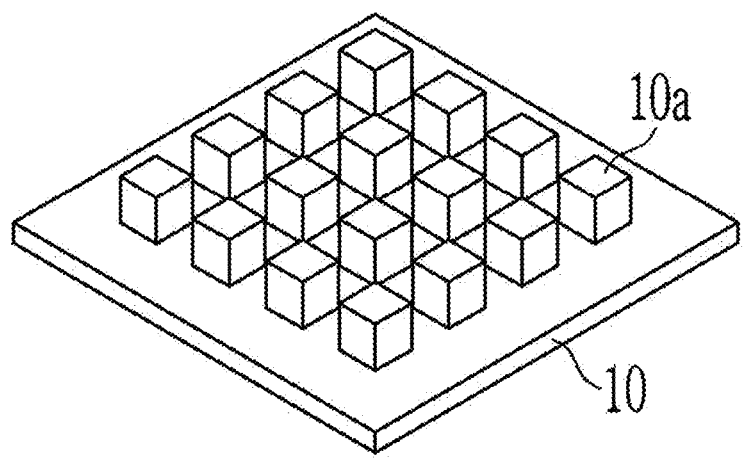
Figure 4B:
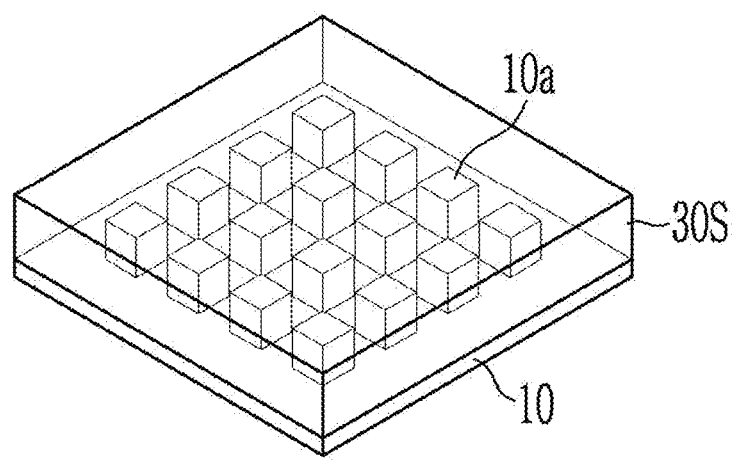
Figure 4C:
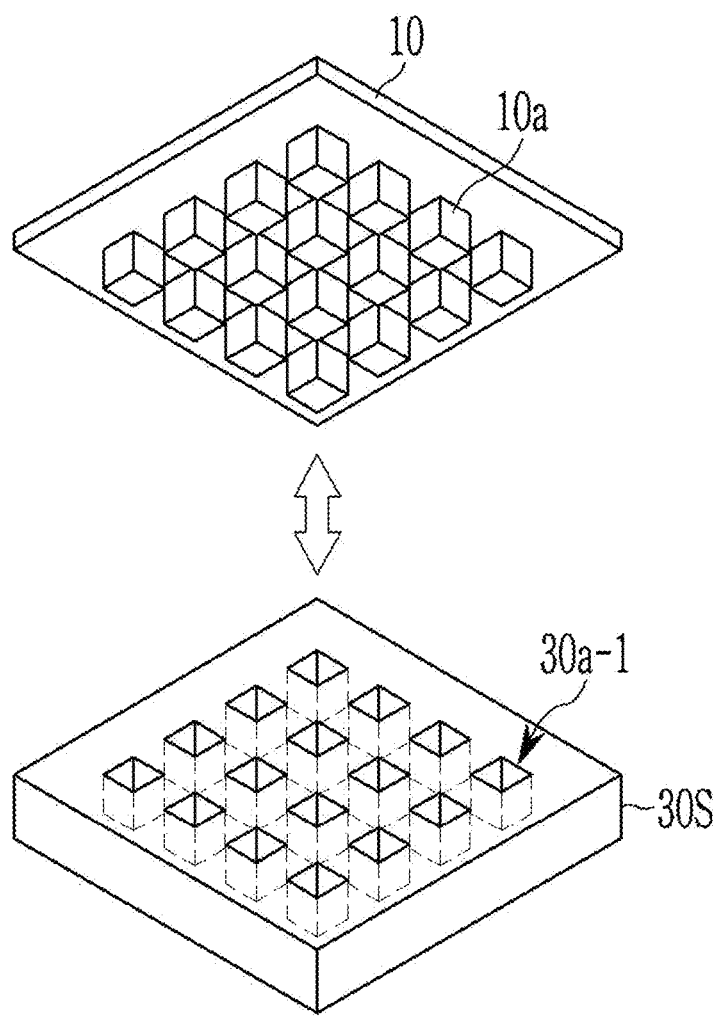

For example, the patterned mold 30 may be manufactured by using a photosensitive resin and an elastic polymer. For example, referring to FIG. 4A, the photosensitive resin is coated on the support substrate 10 and then, photo-etched to form a plurality of convex patterns 10a having a predetermined shape and dimension. The convex pattern 10a may have substantially equivalent shape and dimension to those of the concave micro pattern 30a-1 except the concave/convex are reversed. Referring to FIG. 4B, an elastic polymer solution is coated to form an elastic polymer film 30S on the support substrate 10 on which the convex pattern 10a is formed. The elastic polymer solution may include an elastic polymer such as polydimethylsiloxane (PDMS) and a cross-linking agent. The cross-linking agent may be included in an amount of about 0.1 to 50 parts by weight based on 100 parts by weight of the elastic polymer. Subsequently, the elastic polymer film 30S is cured. The curing may be for example thermal curing and/or photo curing, and for example, the thermal curing may be performed at about 50° C. to about 200° C. for about 1 hour to about 10 hours. Referring to FIG. 4C, the support substrate 10 and the cured elastic polymer film 30S are separated each other to obtain the mold 30 having a plurality of the concave micro patterns 30a-1.

Next, a perovskite precursor solution is prepared. The perovskite precursor solution may include a perovskite precursor, a hydrophilic polymer, and optionally a ligand.

The perovskite precursor solution may be prepared, for example, by mixing cations and anions in a solvent. Herein, the perovskite precursor solution may be prepared by separately preparing a cation solution in which a cation and a solvent are blended and an anion solution in which an anion and a solvent are blended and then blending the cation solution and the anion solution. Alternatively, the perovskite precursor solution may be prepared by blending a cation and an anion in a solvent.

The cation may be supplied in a form of a compound that is capable of supplying, for example a monovalent inorganic cation such as $Li^+$, $Na^+$, $K^+$, $Rb^+$, and $Cs^+$, a monovalent organic cation such as an organic ammonium cation and an organic amino cation; a divalent metal cation including a transition metal, a rare earth element, an alkaline-earth metal, or a combination thereof such as $Pb^{2+}$, $Sn^{2+}$, $Ge^{2+}$, $Ga^{2+}$, $In^{2+}$, $Al^{2+}$, $Sb^{2+}$, $Bi^{2+}$, and $PO^{2+}$, or a combination thereof. The anion may be supplied in a form of a compound that is capable of supplying, for example, a halide anion. For example, the monovalent organic cation may be alkylammonium, arylammonium, arylalkylammonium, alkylamidinium, arylamidinium, arylalkylamidinium, or a combination thereof, having from 1 to 40 carbon atoms for example, such as methylammonium, formamidinium, or phenylammonium, n-butyl ammonium, 2-phenylmethylammonium, or 2-phenylethylammonium, $CH_3NH_3$, $HC(NH_2)_2$, $C_4H_6NH_3$, $C_6H_5CH_2NH_3$, $C_6H_5C_2H_4NH_3$, $C_6H_{13}NH_3$, or a combination thereof, but is not limited thereto. The divalent metal cation may be, for example, $Pb^{2+}$ or $Sn^{2+}$, and the halide anion may be, for example, $F^-$, $Cl^-$, $Br^-$, or $I^-$.

The hydrophilic polymer may include polyvinylpyrrolidone, polyethyleneamine, polyacrylamide, poly(meth)acrylate, polyvinyl alcohol, polyethylene glycol, polyethyleneoxide, polyoxazoline, a derivative thereof, or a copolymer thereof.

The ligand may include for example aliphatic hydrocarbon and/or aromatic hydrocarbon and may be, for example derived from RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, RPO (OH)$_2$, RPOOH, RHPOOH, or $R_2POOH$ (wherein, R is independently a substituted or unsubstituted C1 to C40 aliphatic hydrocarbon, a substituted or unsubstituted C6 to C40 aromatic hydrocarbon, or a combination thereof), for example methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine, oleyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, a substituted or unsubstituted octylphosphine (e.g., trioctylphosphine (TOP)), and the like; phosphine oxide such as a substituted or unsubstituted methyl phosphine oxide (e.g., trimethyl phosphine oxide, methyldiphenyl phosphineoxide, etc.), a substituted or unsubstituted ethyl phosphine oxide (e.g., triethyl phosphine oxide, ethyldiphenyl phosphineoxide, etc.), a substituted or unsubstituted propyl phosphine oxide, a substituted or unsubstituted butyl phosphine oxide, a substituted or unsubstituted octylphosphine oxide (e.g., trioctylphosphine oxide (TOPO), and the like; diphenyl phosphine, triphenyl phosphine compound or an oxide compound thereof; C2 to C40 phosphonic acid; C2 to C40 phosphinic acid, but is not limited thereto.

The solvent is not particularly limited as long as it may dissolve or disperse the aforementioned components. The solvent may be, for example, an organic solvent, for example, dimethylformamide, dimethylsulfoxide, or a combination thereof, but is not limited thereto.

The perovskite precursor, hydrophilic polymer, ligand, and solvent may be included in each amount of about 5 wt % to about 50 wt %, about 1 wt % to 30 wt %, about 0.001 wt % to about 10 wt %, and a balance, respectively, based on a total amount of the perovskite precursor solution.

Figure 5:
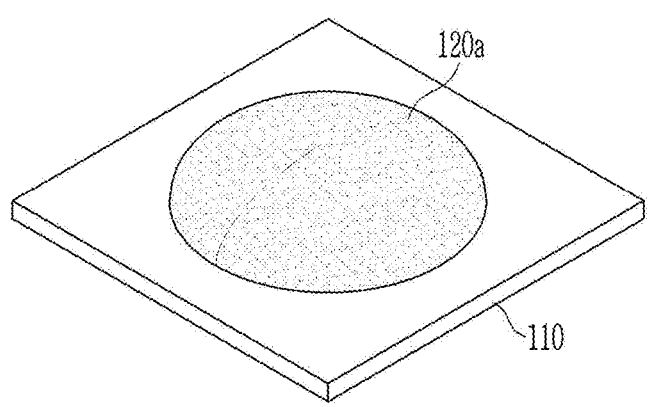

Then, referring to FIG. 5, on the substrate 110, a perovskite precursor solution 120a is coated. The coating is performed through a solution process, for example, such as a spin coating, a slit coating, an inkjet coating, a nozzle printing, spraying, a drip and/or doctor blade coating, but is not limited thereto.

Figure 6:
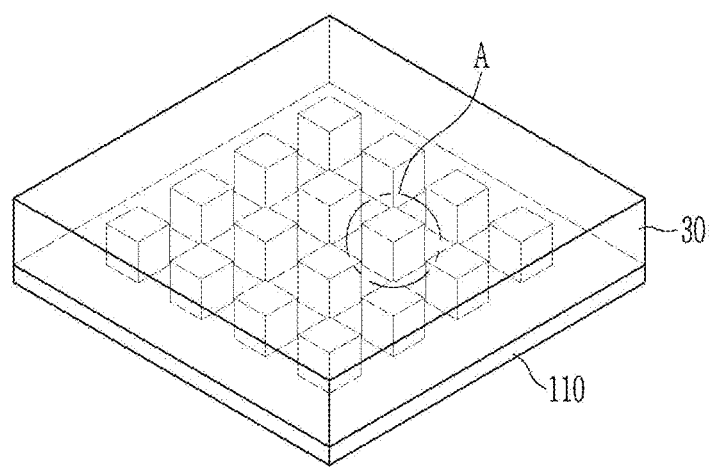
Figure 7:
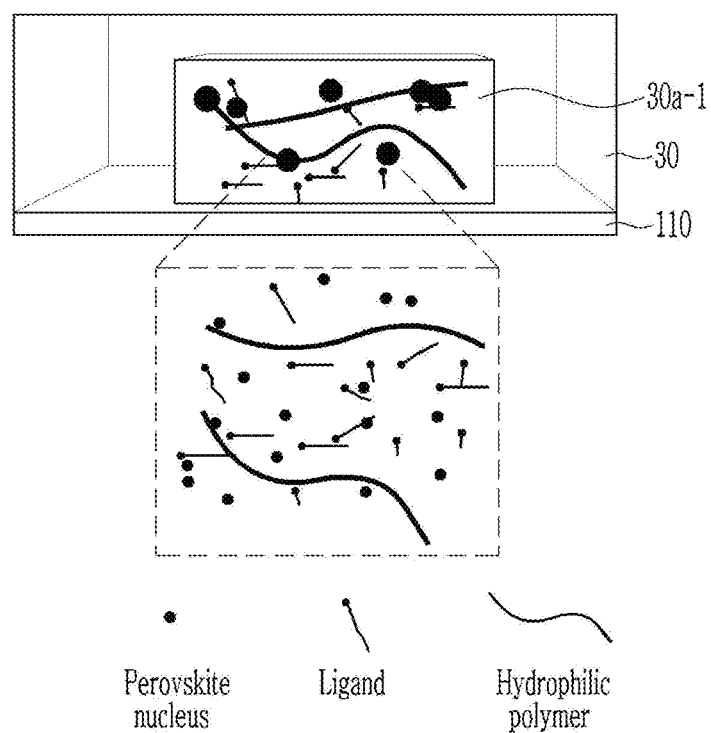

Subsequently, referring to FIG. 6, the patterned mold 30 is disposed on the coated perovskite precursor solution 120a and then, pressed. Accordingly, as shown in FIG. 7, the perovskite precursor solution 120a may be confined in each concave micro pattern 30a-1. Herein, as described above, since the hydrophilic polymer may increase wettability of the perovskite precursor solution 120a with respect to the substrate 110, the perovskite precursor solution 120a may be widely spread in the concave micro pattern 30a-1 and confined into a substantially equivalent shape to a planar shape of the concave micro pattern 30a-1.

Figure 8:
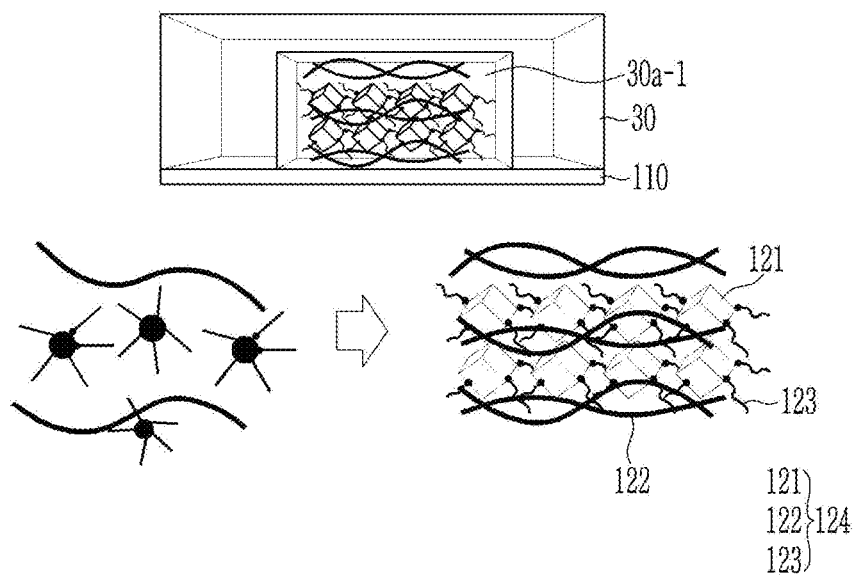

Subsequently, the substrate 110 may be heat-treated. The heat treatment may be performed, for example, at about 50° C. to 200° C. for about 1 minute to about 10 hours, but is not limited thereto. Accordingly, as shown in FIG. 8, the solvent is removed from the perovskite precursor solution 120a to obtain the composite 124 of the perovskite nanocrystals 121 grown from the perovskite precursor, the hydrophilic polymer 122, and optionally, the ligand 123.

Figure 9:
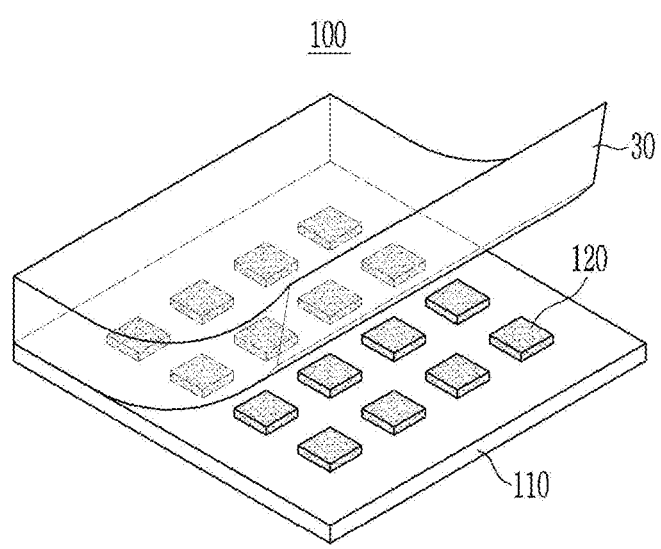

Referring to FIG. 9 and FIGS. 1 and 2, the mold 30 is separated from the substrate 110 to obtain the composite 124 including the perovskite nanocrystals 121, the hydrophilic polymer 122, and optionally, the ligand 123. The microstructure 120 may be substantially the same dimension as that of the concave micro pattern 30a-1 of the mold 30 or a smaller dimension than that of the concave micro pattern 30a-1 due to a contraction according to the heat treatment and the like. Referring to FIG. 1, the plurality of microstructures 120 are aligned to form the microstructure array 100.

In this way, the microstructure array 100 according to the embodiment may use the mold 30 having the concave micro pattern 30a-1 to effectively obtain the perovskite nanocrystals having a submicrometer crystal dimension by beforehand defining a predetermined region where the microstructures 120 will be formed (e.g., a subpixel region of a post-described micro light emitting diode), supplying this predetermined region with the perovskite precursor solution including the perovskite precursor, the hydrophilic polymer, and optionally, the ligand, and crystallizing it. Accordingly, the perovskite crystallization and the micro pattern formation are simultaneously performed in a simpler process than the conventional process of separately performing the perovskite crystallization and the micro pattern.

In addition, this process may be performed under non-vacuum (e.g., the atmospheric pressure) and thus need no separate equipment such as a vacuum device and resultantly reduce a process cost.

In addition, since this process is performed by using the perovskite precursor solution including the perovskite precursor, the hydrophilic polymer, and optionally, the ligand in a confined space inside the concave micro pattern 30a-1, the microstructures 120 having a desired shape and dimension as well as the submicrometer crystal dimension may be effectively formed due to a high substrate wettability effect of the hydrophilic polymer and a perovskite crystal growth-control effect of the ligand.

In addition, this process is performed in a solution process of using the perovskite precursor solution and thus may be effectively used to manufacture a large area micro light emitting diode at a low cost.

The microstructure array 100 may be applied as an active layer of a micro light emitting diode.

Hereinafter, a micro light emitting diode according to an embodiment is described with reference to the drawings.

Figure 10:
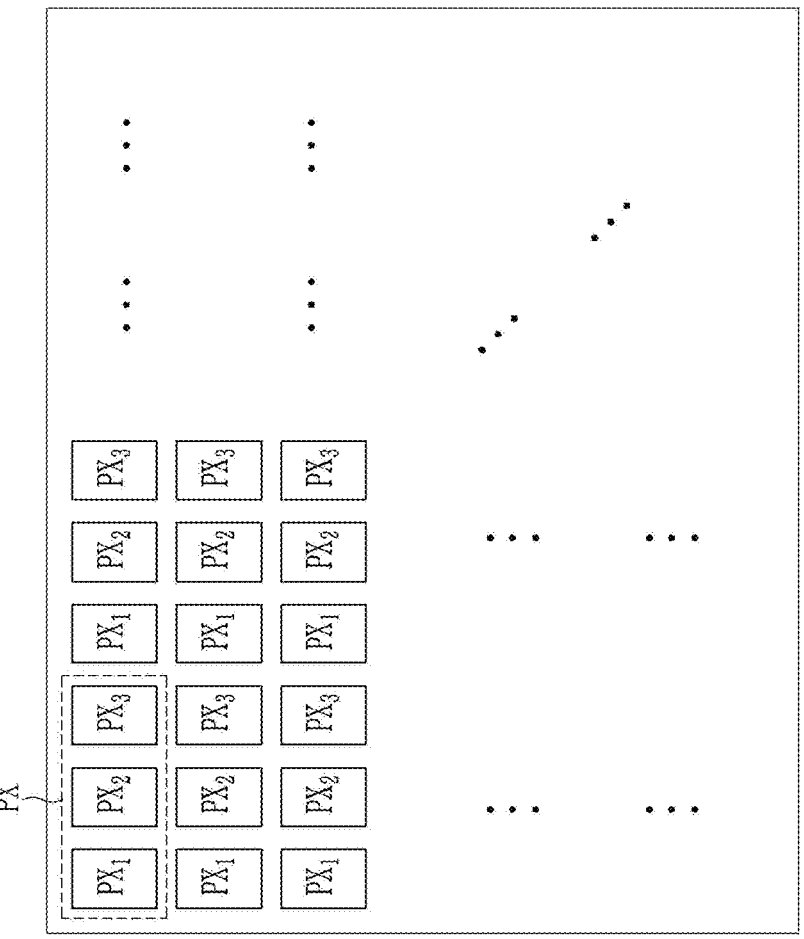
FIG. 10 is a schematic view showing an example of an arrangement of subpixels of a micro light emitting diode according to an embodiment.
Figure 11:
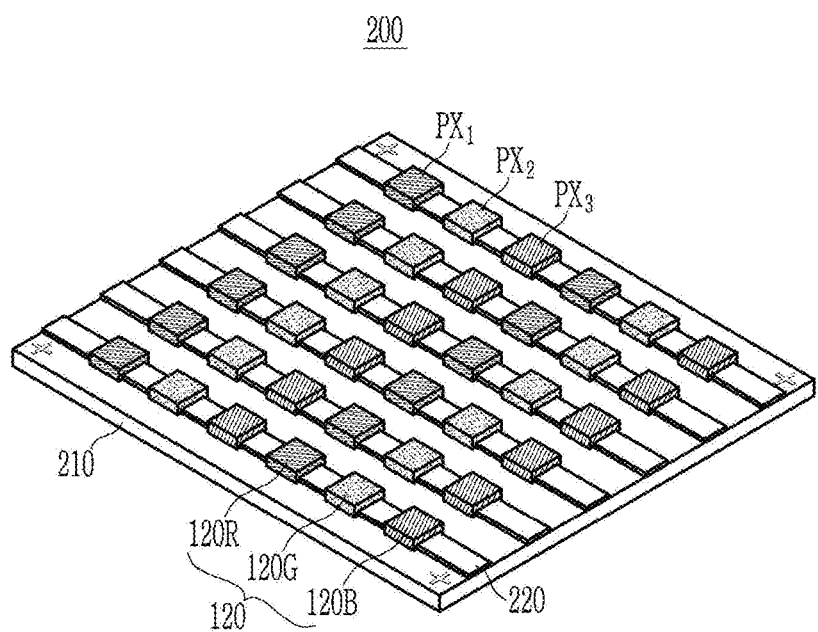
FIG. 11 is a schematic view showing a micro light emitting diode according to an embodiment.
Figure 12:
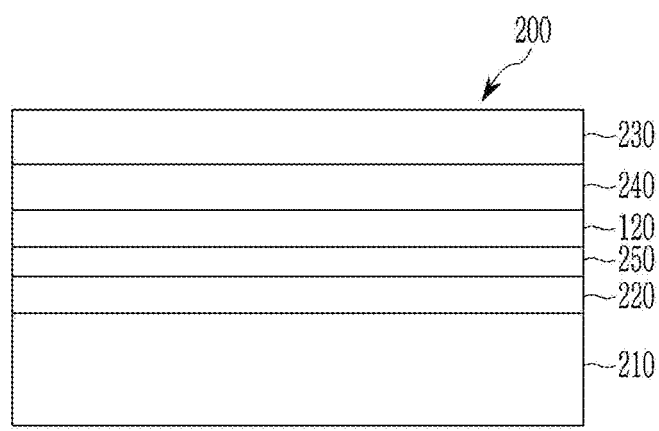
FIG. 12 is a cross-sectional view showing one subpixel of the micro light emitting diode of FIG. 11, FIG. 13A, FIG. 13B, FIG. 13C, FIG. 14, FIG. 15, FIG. 16, FIG. 17, FIG. 18, FIG. 19, and FIG. 20 are schematic views showing an example of a method of manufacturing a micro light emitting diode according to an embodiment.

FIG. 10 is a schematic view showing an example of an arrangement of subpixels of a micro light emitting diode according to an embodiment, FIG. 11 is a schematic view showing a micro light emitting diode according to an embodiment, and FIG. 12 is a cross-sectional view showing one subpixel of the micro light emitting diode of FIG. 11.

Referring to FIG. 10, the micro light emitting diode 200 according to an embodiment includes a plurality of subpixels $PX_1$, $PX_2$, and $PX_3$, and the plurality of subpixels $PX_1$, $PX_2$, and $PX_3$ may have a matrix arrangement which is repeatedly arranged along columns and/or rows. The plurality of subpixels $PX_1$, $PX_2$, and $PX_3$ displaying different colors may form one pixel PX. For example, a subpixel displaying red, a subpixel displaying green, and a subpixel displaying blue may form one pixel. In FIG. 10, the arrangement of the rectangular subpixels ($PX_1$, $PX_2$, and $PX_3$) repeatedly arranged along rows and columns is exemplarily illustrated, but the shape and arrangement of the subpixels $PX_1$, $PX_2$, and $PX_3$ are not limited thereto.

The subpixels $PX_1$, $PX_2$, and $PX_3$ may have an island-shape having a dimension of several to several tens of micrometers, and may have a planar shape of a polygonal shape such as a square, rectangular, hexagonal, or octagonal shape, a circular shape or an elliptical shape, but are not limited thereto. Herein, the dimension may be a width and/or a length, and when the planar shape of the subpixels $PX_1$, $PX_2$, and $PX_3$ is a circular or elliptical shape, the width may be a diameter or a long diameter.

The dimension of the subpixels $PX_1$, $PX_2$, and $PX_3$ may be substantially the same as the dimension of the aforementioned microstructures 120. For example, the dimension of the subpixels $PX_1$, $PX_2$, and $PX_3$ may be less than about 100 μm, within the range, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 15 μm, less than or equal to about 10 μm, or less than or equal to about 7 μm, within the range, about 1 μm to about 80 μm, about 1 μm to about 70 μm, about 1 μm to about 60 μm, about 1 μm to about 50 μm, about 1 μm to about 40 μm, about 1 μm to about 30 μm, about 1 μm to about 20 μm, about 1 μm to about 15 μm, about 1 μm to about 10 μm, or about 1 μm to about 7 μm.

Referring to FIGS. 11 and 12, the micro light emitting diode 200 according to an embodiment includes a substrate 210; a first electrode 220 formed on the substrate 210; a charge auxiliary layer 250 formed on the first electrode 220; a microstructure array 100 including microstructures 120 formed on the charge auxiliary layer 250; a charge auxiliary layer 240 formed on the microstructures 120; and a second electrode 230.

The substrate 210 may be made of, for example, inorganic materials such as glass; organic materials such as polycarbonate, polymethyl methacrylate, polyethylene terephthalate, polyethylene naphthalate, polyamide, polyether sulfone, or combinations thereof; or a silicon wafer.

The first electrode 210 and the second electrode 230 may face each other, and one of the first electrode 210 and the second electrode 230 is an anode and the other is a cathode. For example, the first electrode 210 may be an anode and the second electrode 230 may be a cathode. For example, the first electrode 210 may be a cathode and the second electrode 230 may be an anode.

At least one of the first electrode 210 and the second electrode 230 may be a light-transmitting electrode, and the light-transmitting electrode may be made of, for example, zinc oxide, indium oxide, tin oxide, indium tin oxide (ITO), indium zinc oxide (IZO) or a conductive metal oxide such as fluorine-doped tin oxide, or a metal thin layer of a single layer or a multilayer. When one of the first electrode 210 and the second electrode 230 is an opaque electrode, the opaque electrode may be made of an opaque conductor such as aluminum (Al), silver (Ag), or gold (Au).

The microstructures 120 are disposed between the first electrode 210 and the second electrode 230. The microstructures 120 includes the composite 124 including the perovskite nanocrystals 121, hydrophilic polymer 122, and optionally ligand 123, as described above, and the detailed descriptions are as described above.

The microstructure array 100 may include a plurality of microstructures 120 capable of emitting light in a predetermined wavelength range of visible light wavelength regions, for example, a first microstructure array including a plurality of first microstructures 120R configured to emit light in a first wavelength region; a second microstructure array including a plurality of second microstructures 120G configured to emit light in a second wavelength region; and a third microstructure array including a plurality of third microstructures 120B configured to emit light in the third wavelength region. Herein, the first microstructures 120R, the second microstructures 120G, and the third microstructures 120B may be disposed adjacently.

For example, the subpixel (PX$_1$) may include the first microstructures 120R, the subpixel (PX$_2$) may include the second microstructure 120G, and the subpixel (PX$_3$) may include the third microstructures 120B. For example, the first, second, and third wavelength regions may be different wavelength regions of the visible wavelength region, for example, one of the red wavelength region, the green wavelength region, and the blue wavelength region. For example, the first wavelength region may be a red wavelength region, the second wavelength region may be a green wavelength region, and the third wavelength region may be a blue wavelength region.

The charge auxiliary layers 240 and 250 may be a hole auxiliary layer or an electron auxiliary layer, for example, a hole injection layer, a hole transport layer, an electron blocking layer, an electron injection layer, an electron transport layer, and/or a hole blocking layer. The charge auxiliary layers 240 and 250 may include an organic material, an inorganic material, and/or an organic/inorganic material. Either or both of the charge auxiliary layers 240 and 250 may be omitted.

The micro light emitting diode 200 may be a bottom emission type that emits light toward the substrate 110, a top emission type that emits light toward the opposite side of the substrate 110, or a dual emission type that emits light toward both the side of the substrate 110 and the opposite side of the substrate 110, depending on the first electrode 210 and the second electrode 230.

For example, when the first electrode 210 is a light-transmitting electrode and the second electrode 230 is a non-light-transmitting electrode, the micro light emitting diode 200 may be bottom emission type.

For example, when the first electrode 210 is a non-light-transmitting electrode and the second electrode 230 is a light-transmitting electrode, the micro light emitting diode 200 may be top emission type.

For example, when the first electrode 210 and the second electrode 230 are light-transmitting electrodes, the micro light emitting diode 200 may be dual emission type.

Hereinafter, a method of manufacturing a micro light emitting diode according to an embodiment is described with reference to the drawings.

FIG. 13A, FIG. 13B, FIG. 13C, FIG. 14, FIG. 15, FIG. 16, FIG. 17, FIG. 18, FIG. 19, and FIG. 20 are schematic views showing an example of a method of manufacturing a micro light emitting diode according to an embodiment.

Figure 13A:
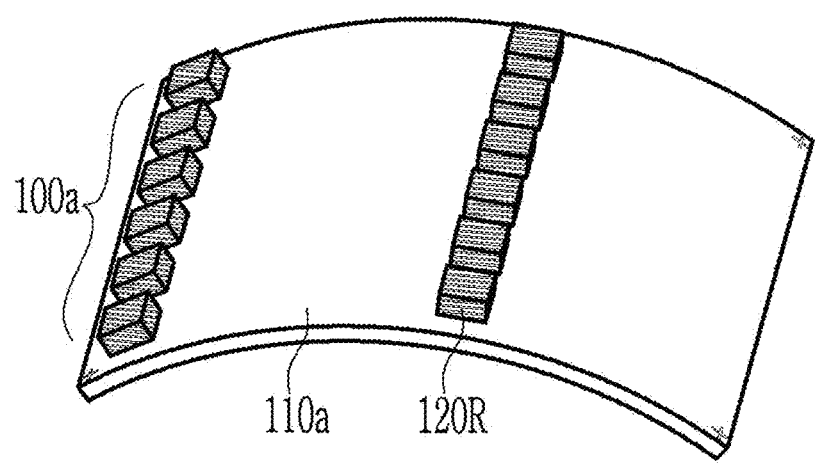

Referring to FIG. 13A, a microstructure array is formed on the transfer substrate 110a according to the above-described method to form a first microstructure array 100a including a plurality of first microstructures 120R.

Figure 13B:
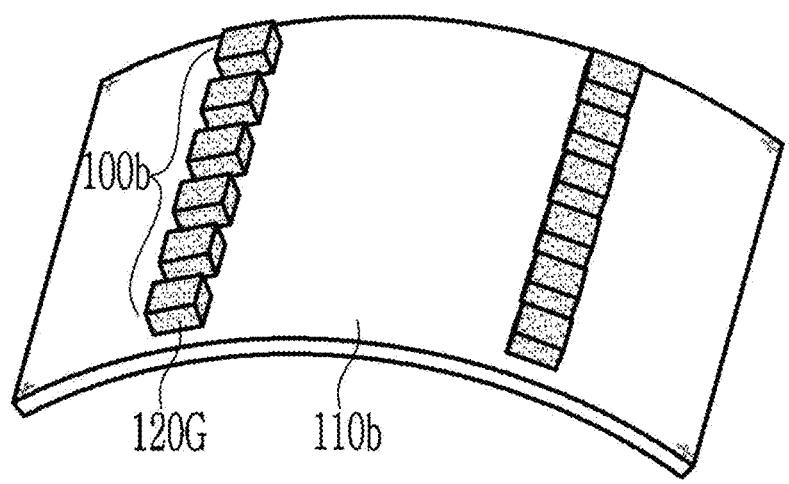

Referring to FIG. 13B, a microstructure array is formed on the transfer substrate 110b according to the above-described method to form a second microstructure array 100b including a plurality of second microstructures 120G.

Figure 13C:
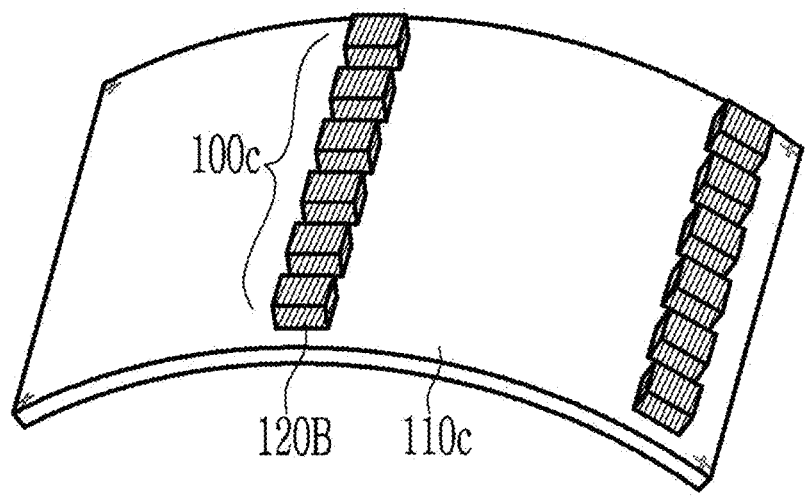

Referring to FIG. 13C, a microstructure array is formed on the transfer substrate 110c according to the above-described method to form a third microstructure array 100c including a plurality of third microstructures 120B.

Figure 14:
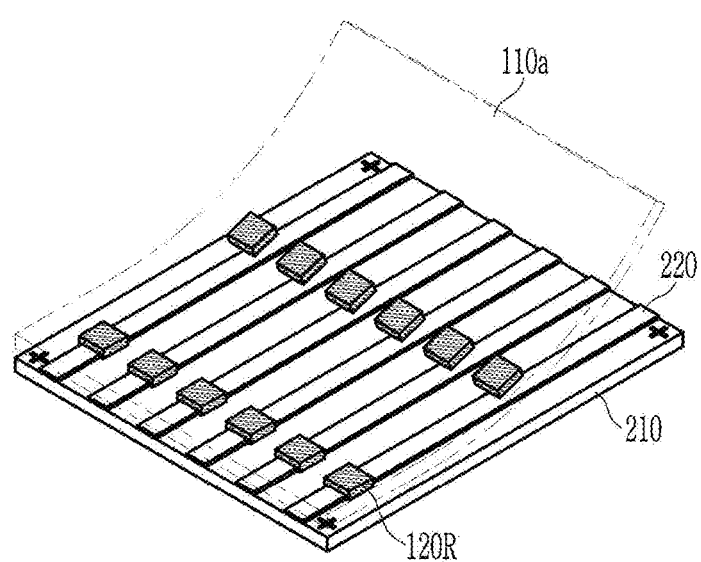

Referring to FIG. 14, a first electrode 220 is formed on a substrate 210. The first electrode 220 may have a plurality of stripe shapes extending along one direction but is not limited thereto and is independently disposed in each subpixel. Subsequently, a charge auxiliary layer (not shown) may be optionally formed on the first electrode 220.

Next, the transfer substrate 110a is disposed on the first electrode 220, and the plurality of first microstructures 120R is transferred on the first electrode 220. Subsequently, the transfer substrate 110a is removed.

Figure 15:
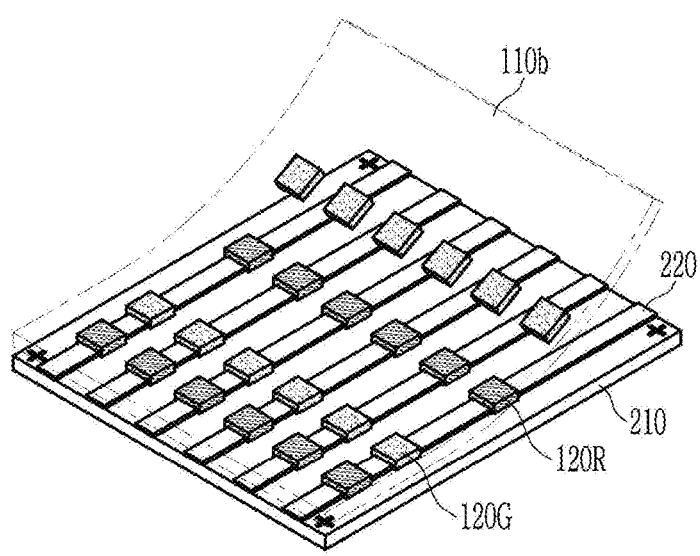

Referring to FIG. 15, the transfer substrate 110b is disposed on the first electrode 220, and the plurality of second microstructures 120G is transferred on the first electrode 220. The second microstructures 120G may be disposed near to the first microstructures 120R. Subsequently, the transfer substrate 110b is removed.

Figure 16:
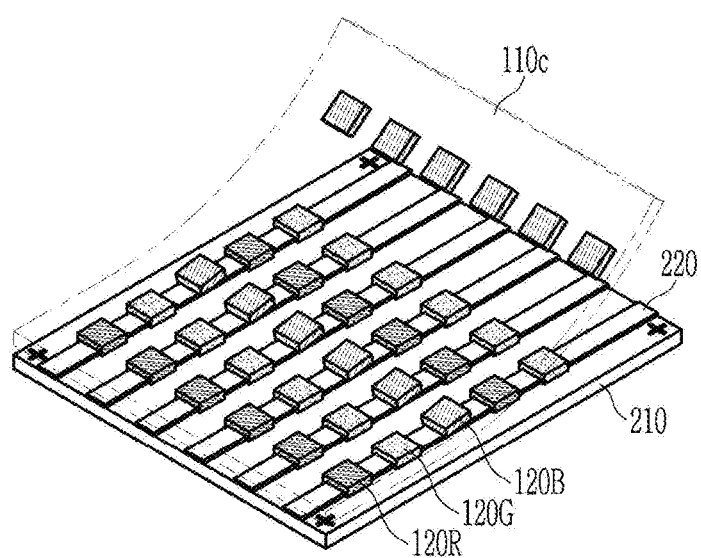

Referring to FIG. 16, the transfer substrate 110c is disposed on the first electrode 220, and the plurality of third microstructures 120B is transferred on the first electrode 220. The third microstructures 120B may be disposed near to the second microstructures 120G. Subsequently, the transfer substrate 110c is removed.

Accordingly, the first microstructure array 120a including the plurality of first microstructures 120R, the second microstructure array 120b including the second microstructures 120G, and the third microstructure array 120c including the third microstructures 120B are arranged in parallel to form the microstructure array 100.

Figure 17:
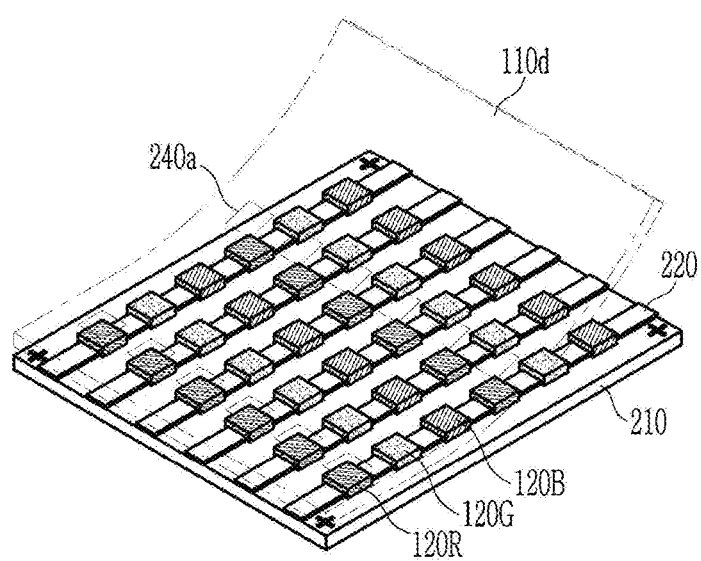

Referring to FIG. 17, the transfer substrate 110d having the first charge auxiliary layer 240a is disposed on the microstructure array 100, and the first charge auxiliary layer 240a is transferred on the first microstructures 120R. Subsequently, the transfer substrate 110d is removed.

Figure 18:
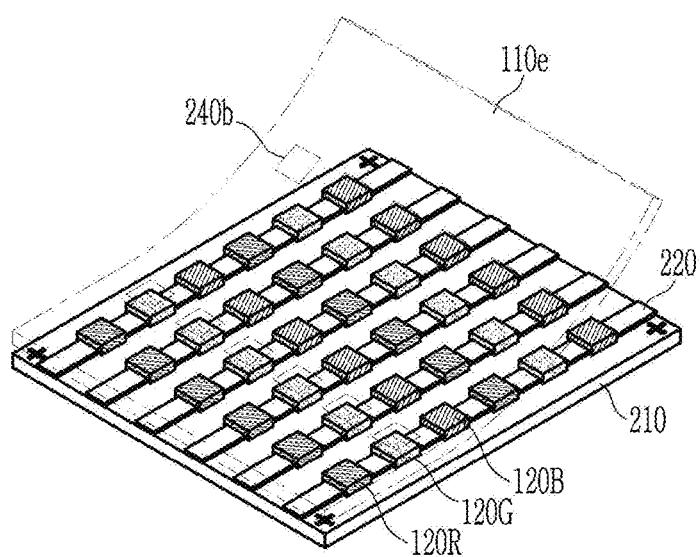

Referring to FIG. 18, the transfer substrate 110e having the second charge auxiliary layer 240b is disposed on the microstructure array 100, and the second charge auxiliary layer 240b is transferred on the second microstructures 120G. Subsequently, the transfer substrate 110e is removed.

Figure 19:
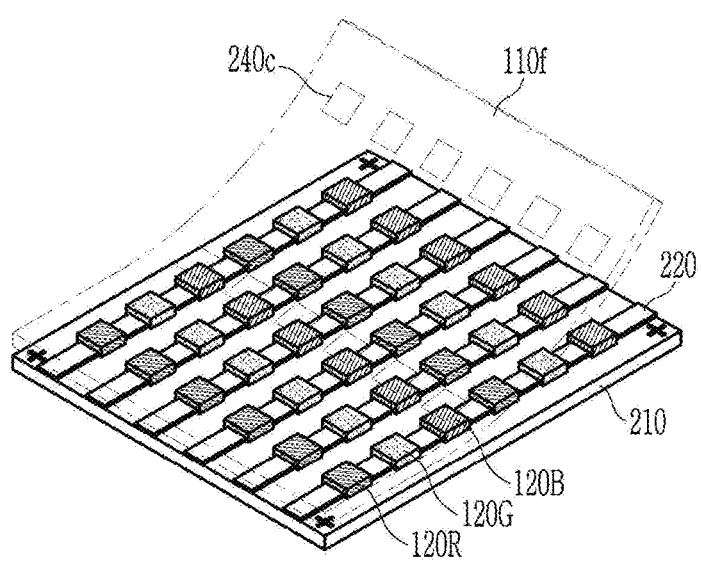

Referring to FIG. 19, the transfer substrate 110f having the third charge auxiliary layer 240c is disposed on the microstructure array 100, and the third charge auxiliary layer 240c is transferred on the third microstructures 120B. Subsequently, the transfer substrate 110f is removed.

Accordingly, the first, second, and third charge auxiliary layers 240a, 240b, and 240c are formed on the microstructure array 100. The first, second, and third charge auxiliary layers 240a, 240b, and 240c may be omitted, optionally.

Figure 20:
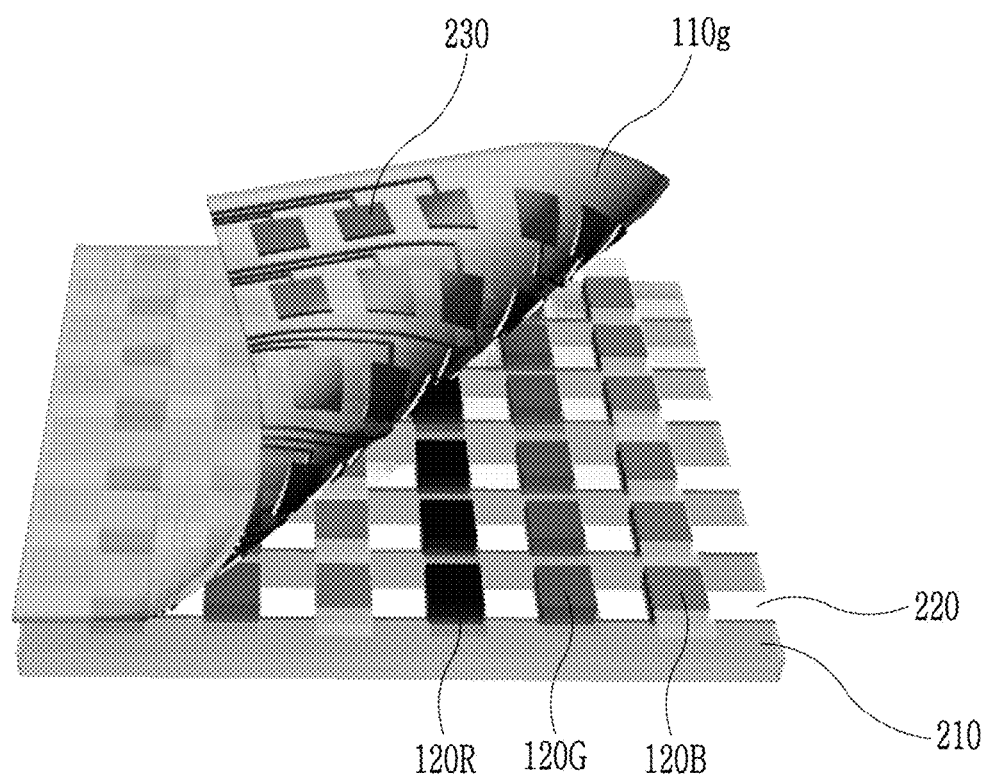

Subsequently, referring to FIG. 20, the transfer substrate 110g having the second electrode 230 is disposed on the first, second, and third microstructures 120R, 120G, 120B (or the first, second, and third charge auxiliary layers 240a, 240b, and 240c), and the second electrode 230 is transferred on the first, second, and third microstructures 120R, 120G, 120B (or the first, second, and third charge auxiliary layers 240a, 240b, and 240c). Subsequently, the transfer substrate 110g is removed.

Accordingly, a micro light emitting diode including the first electrode 220; microstructure array 100; (optionally) the charge auxiliary layers 240a, 240b, and 240c; and the second electrode 230 on the substrate 210 may be formed.

The aforementioned micro light emitting diode may be applied to various electronic devices requiring light emission, for example, a display device or a illumination device, but is not limited thereto.

Hereinafter, the embodiments are illustrated in more detail with reference to examples. However, these examples are exemplary, and the present scope is not limited thereto.

Preliminary Example: Manufacture of Mold

Preliminary Example 1

A p-type Si substrate deposited with SiO$_2$ to be 300 nm thick is sequentially washed with acetone, isopropyl alcohol, and ultra-pure water. Subsequently, an epoxy-base photoresist (SU-8, Microchem Corp.) is spin-coated on the Si substrate to form a film. Subsequently, the film is sequentially treated with photolithography and etched to form a plurality of 10 μm×10 μm×10 μm (width×length×thickness) hexahedron-shaped convex micro patterns. Subsequently, an elastomer prepared by blending a polydimethylsiloxane (PDMS) base and a hardener (Sylgard 184, Dowcorning) in a weight ratio of 10:1 is poured on the convex micro patterns of the film, and then, cured at 80° C. for 3 hours. The cured polydimethylsiloxane (PDMS) is separated from the patterned $SiO_2$ substrate to obtain a polydimethylsiloxane (PDMS) mold having the concave micro pattern of a plurality of 10 μm×10 μm×10 μm (width×length×depth) square cross-sections.

Preliminary Example 2

A polydimethylsiloxane (PDMS) mold having a concave micro pattern of a plurality of 50 μm×50 μm×50 μm (width×length×depth) square cross-sections is obtained according to the same method as Preliminary Example 1 except that the convex micro pattern of the $SiO_2$ substrate is formed into a 50 μm×50 μm×50 μm (width×length×thickness) hexahedron shape.

Preliminary Example 3

A polydimethylsiloxane (PDMS) mold having a concave micro pattern of a plurality of 25 μm×25 μm×25 μm (width×length×depth) square cross-sections is obtained according to the same method as Preliminary Example 1 except that the convex micro pattern of the $SiO_2$ substrate is formed into a 25 μm×25 μm×25 μm (width×length×thickness) hexahedron shape.

Preliminary Example 4

A polydimethylsiloxane (PDMS) mold having a concave micro pattern of a plurality of a plurality of 10 μm (diameter)×10 μm (depth) circular cross-sections is obtained according to the same method as Preliminary Example 1 except that the convex micro pattern of the $SiO_2$ substrate is formed into a 10 μm (diameter)×10 μm (depth) cylinder shape.

Preliminary Example 5

A polydimethylsiloxane (PDMS) mold having a concave micro pattern of a plurality of hexagonal cross-sections is obtained according to the same method as Preliminary Example 1 except that the convex micro pattern of the $SiO_2$ substrate is formed into a column having the hexagonal cross-section.

Preliminary Example 6

A polydimethylsiloxane (PDMS) mold having a concave micro pattern of a plurality of octagonal cross-sections is obtained according to the same method as Preliminary Example 1 except that the convex micro pattern of the $SiO_2$ substrate is formed into a column having the octagonal cross-section.

Preparation Example: Preparation of Perovskite Precursor Solution

Preparation Example 1

150 mg of methyl ammonium bromide (MABr, Sigma-Aldrich Co., Ltd.), 250 mg of lead bromide ($PbBr_2$, Sigma-Aldrich Co., Ltd.), and 10 mg of polyvinylpyrrolidone (PVP, Sigma-Aldrich Co., Ltd.) are dissolved in 1 mL of N,N-dimethyl formamide (DMF, Alfa-Aesar) to prepare a perovskite precursor solution. The perovskite precursor solution is sufficiently stirred with a spin bar in a closed and sealed state at room temperature.

Preparation Example 2

A perovskite precursor solution is prepared according to the same method as Preparation Example 1 except that the polyvinylpyrrolidone is used in an amount of 20 mg.

Preparation Example 3

A perovskite precursor solution is prepared according to the same method as Preparation Example 1 except that the polyvinylpyrrolidone is used in an amount of 30 mg.

Preparation Example 4

A perovskite precursor solution is prepared according to the same method as Preparation Example 1 except that the polyvinylpyrrolidone is used in an amount of 40 mg.

Preparation Example 5

A perovskite precursor solution is prepared according to the same method as Preparation Example 1 except that the polyvinylpyrrolidone is used in an amount of 50 mg.

Preparation Example 6

150 mg of methyl ammonium bromide, 250 mg of lead bromide, and 10 mg of polyvinylpyrrolidone are dissolved in 0.97 mL of dimethyl formamide, and 0.03 mL of oleyl amine is added thereto to prepare a perovskite precursor solution. The perovskite precursor solution is sufficiently stirred with a spin bar in a closed and sealed state at room temperature.

Preparation Example 7

65 mg of cesium iodide, (CsI, Sigma-Aldrich Co., Ltd.), 115 mg of lead iodide ($PbI_2$, Sigma-Aldrich Co., Ltd.), 55 mg of cesium bromide (CsBr, Sigma-Aldrich Co., Ltd.), 90 mg of lead bromide ($PbBr_2$, Sigma-Aldrich Co., Ltd.), and 60 mg of poly-2-ethyl-2-oxazoline (PEOXA, Sigma-Aldrich Co., Ltd.) are dissolved in 1 mL of dimethyl sulfoxide (DMSO, Alfa-Aesar) to prepare a perovskite precursor solution. The perovskite precursor solution is sufficiently stirred with a spin bar in a closed and sealed state at room temperature.

Preparation Example 8

70 mg of methyl ammonium chloride (MACl, Sigma-Aldrich Co., Ltd.), 75 mg of cesium bromide (CsBr, Sigma-Aldrich Co., Ltd.), 130 mg of lead bromide (PbBr2, Sigma-Aldrich Co., Ltd.), and 10 mg of polyvinylpyrrolidone (PVP, Sigma-Aldrich Co., Ltd.) are dissolved in 1 mL of dimethylsulfoxide (DMSO, Alfa-Aesar) to prepare a perovskite precursor solution. The perovskite precursor solution is sufficiently stirred with a spin bar in a closed and sealed state at room temperature.

Comparative Preparation Example 1

A perovskite precursor solution is prepared according to the same method as Preparation Example 1 except that the polyvinylpyrrolidone is not included.

Evaluation I

Contact angles of the perovskite precursor solutions according to preparation examples and comparative preparation example are evaluated.

The contact angles are measured by respectively dropping 80 μl of each perovskite precursor solution according to preparation examples and comparative preparation example on a glass substrate coated with ITO and PEDOT:PSS by using a Phoenix 300 contact angle analyzer (Surface Electro Optics Co., Ltd.).

The results are shown in Table 1.

TABLE 1

|  | Contact angle (degree) |
| --- | --- |
| Preparation Example 1 | 10.8 |
| Preparation Example 2 | 8.2 |
| Preparation Example 3 | 6.5 |
| Preparation Example 4 | 2.8 |
| Preparation Example 5 | 2.1 |
| Comparative Preparation Example 1 | 20.4 |

Referring to Table 1, the perovskite precursor solutions according to preparation examples exhibit low contact angles compared with the perovskite precursor solution according to comparative preparation example. Accordingly, the perovskite precursor solutions according to Preparation examples are expected to show high wettability with respect to a substrate compared with the perovskite precursor solution according to comparative preparation example.

Example I: Manufacturing Microstructure Array

Example 1

10 μl of the perovskite precursor solution of Preparation Example 1 is coated on an ITO glass substrate having a hole transport layer (HTL) coated with PEDOT:PSS. On the coated perovskite precursor solution, the PDMS mold having a plurality of 10 μm×10 μm×10 μm (width×length×depth) concave micro pattern according to Preliminary Example 1 is placed, pressed and then, heat-treated at 100° C. for 20 minutes. Subsequently, the PDMS mold is removed from the substrate to form a microstructure array including perovskite nanocrystals filled in the plurality of concave micro patterns.

Example 2

A microstructure array is formed according the same method as Example 1 except that the perovskite precursor solution of Preparation Example 2 is used instead of the perovskite precursor solution of Preparation Example 1.

Example 3

A microstructure array is formed according the same method as Example 1 except that the perovskite precursor solution of Preparation Example 3 is used instead of the perovskite precursor solution of Preparation Example 1.

Example 4

A microstructure array is formed according the same method as Example 1 except that the perovskite precursor solution of Preparation Example 4 is used instead of the perovskite precursor solution of Preparation Example 1.

Example 5

A microstructure array is formed according the same method as Example 1 except that the perovskite precursor solution of Preparation Example 5 is used instead of the perovskite precursor solution of Preparation Example 1.

Example 6

A microstructure array is formed according the same method as Example 1 except that the perovskite precursor solution of Preparation Example 6 is used instead of the perovskite precursor solution of Preparation Example 1.

Example 7

A microstructure array is formed according the same method as Example 1 except that the perovskite precursor solution of Preparation Example 7 is used instead of the perovskite precursor solution of Preparation Example 1.

Example 8

A microstructure array is formed according the same method as Example 1 except that the perovskite precursor solution of Preparation Example 8 is used instead of the perovskite precursor solution of Preparation Example 1.

Example 9

A microstructure array is formed according the same method as Example 3 except that the polydimethylsiloxane (PDMS) mold having a concave micro pattern of a plurality of 50 μm×50 μm×50 μm (width×length×depth) square cross-sections according to Preliminary Example 2 is used instead of the PDMS mold according to Preliminary Example 1.

Example 10

A microstructure array is formed according the same method as Example 3 except that the polydimethylsiloxane (PDMS) mold having a concave micro pattern of a plurality of 25 μm×25 μm×25 μm (width×length×depth) square cross-sections according to Preliminary Example 3 is used instead of the PDMS mold according to Preliminary Example 1.

Example 11

A microstructure array is formed according the same method as Example 3 except that a microstructure is formed by using the polydimethylsiloxane (PDMS) mold having a plurality of concave micro pattern having a 10 μm (diameter)×10 μm (height) circular cross-section according to Preliminary Example 4 instead of the PDMS mold according to Preliminary Example 1.

Example 12

A microstructure array is formed according the same method as Example 3 except that a microstructure is formed by using the polydimethylsiloxane (PDMS) mold having a concave micro pattern of a hexagonal cross-section according to Preliminary Example 5 instead of the PDMS mold according to Preliminary Example 1.

Example 13

A microstructure array is formed according the same method as Example 3 except that a microstructure is formed by using the polydimethylsiloxane (PDMS) mold having a concave micro pattern of an octagonal cross-section according to Preliminary Example 6 instead of the PDMS mold according to Preliminary Example 1.

Comparative Example 1

A microstructure array is formed according the same method as Example 3 except that the perovskite precursor solution of Comparative Preparation Example 1 is used instead of the perovskite precursor solution of Preparation Example 3.

Comparative Example 2

A microstructure array is formed according the same method as Example 11 except that a microstructure is formed by using the perovskite precursor solution of Comparative Preparation Example 1 instead of the perovskite precursor solution of Preparation Example 3.

Comparative Example 3

A microstructure array is formed according the same method as Example 12 except that a microstructure is formed by using the perovskite precursor solution of Comparative Preparation Example 1 instead of the perovskite precursor solution of Preparation Example 3.

Comparative Example 4

A microstructure array is formed according the same method as Example 13 except that a microstructure is formed by using the perovskite precursor solution of Comparative Preparation Example 1 instead of the perovskite precursor solution of Preparation Example 1.
Evaluation II The microstructure arrays according to Examples are evaluated.

The microstructure arrays are evaluated using an optical microscope (Olympus) and a scanning electron microscope (S-5000, Hitachi).

The results are shown in FIGS. 21 to 25.

Figure 21:
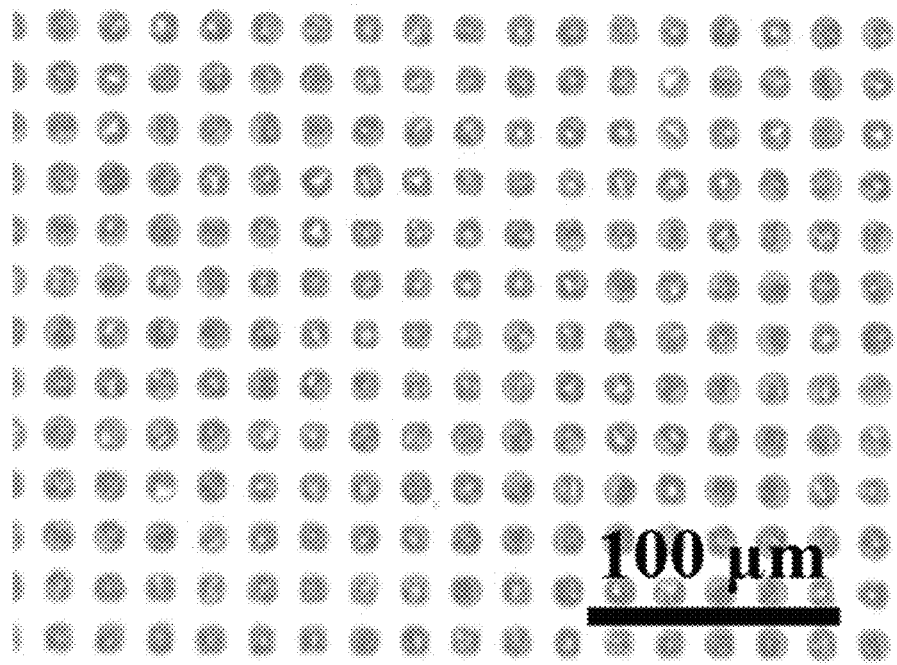
FIG. 21 is a photograph of a microstructure array according to Example 1.
Figure 22:
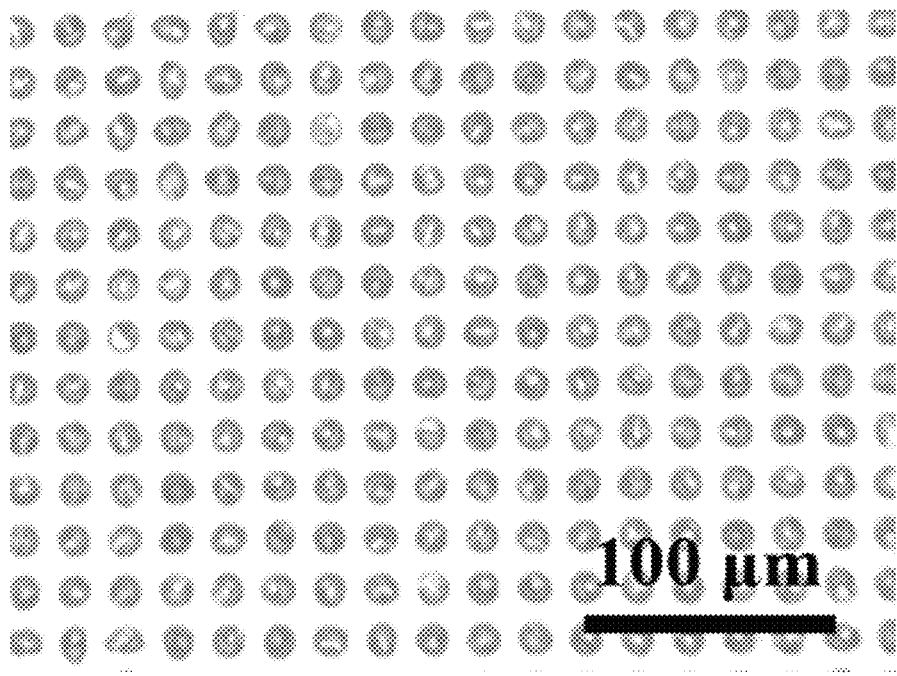
FIG. 22 is a photograph of a microstructure array according to Example 2.
Figure 23:
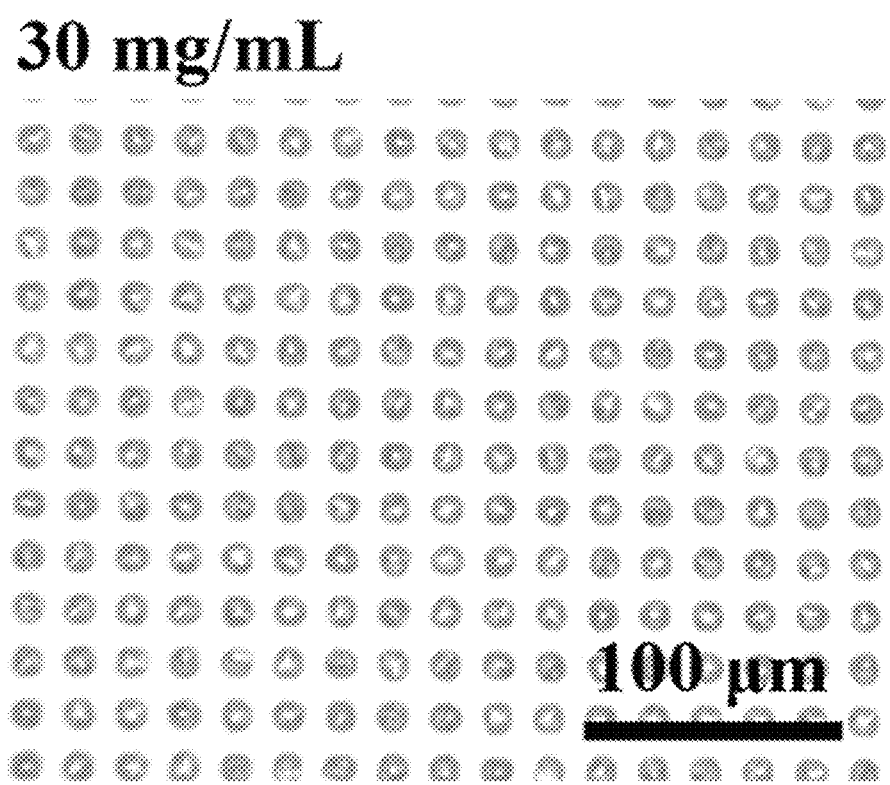
FIG. 23 is a photograph of a microstructure array according to Example 3.
Figure 24:
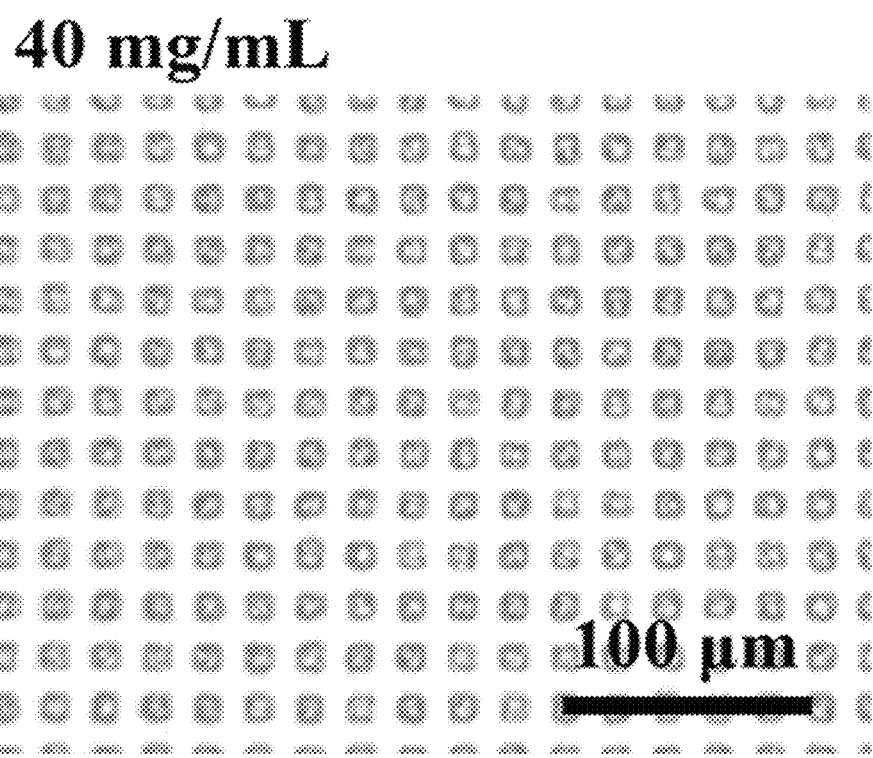
FIG. 24 is a photograph of a microstructure array according to Example 4.
Figure 25:
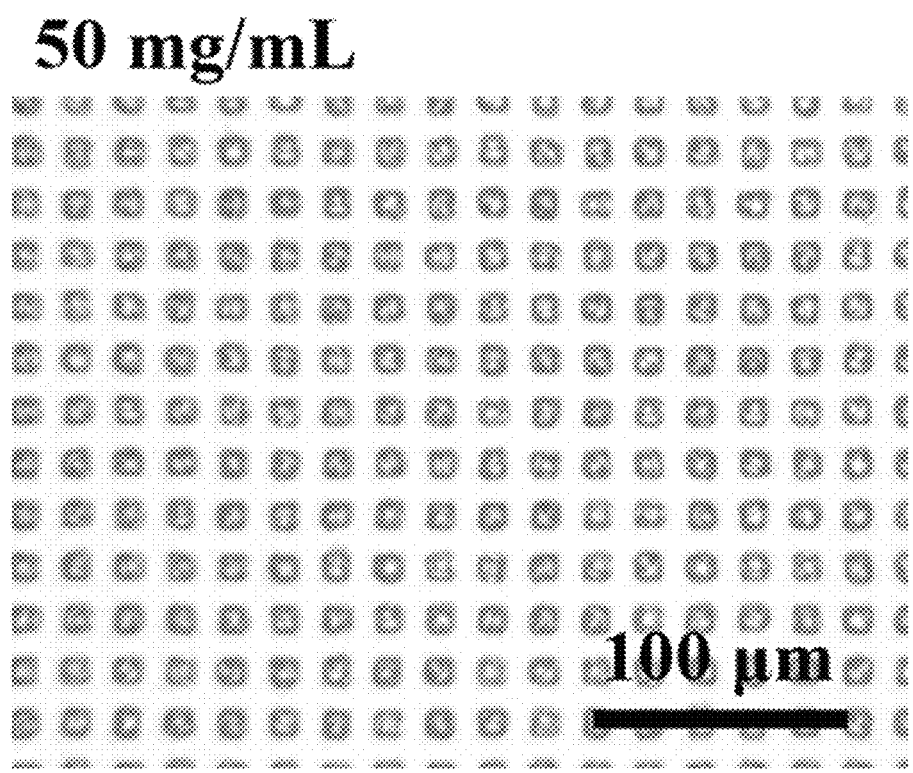
FIG. 25 is a photograph of a microstructure array according to Example 5.

FIG. 21 is a photograph of a microstructure array according to Example 1, FIG. 22 is a photograph of a microstructure array according to Example 2, FIG. 23 is a photograph of a microstructure array according to Example 3, FIG. 24 is a photograph of a microstructure array according to Example 4, and FIG. 25 is a photograph of a microstructure array according to Example 5.

Referring to FIGS. 21 to 25, the microstructure arrays according to examples turn out to have substantially uniform shapes and dimensions.
Evaluation III The microstructure arrays according to Examples 3, 9 and 10 are evaluated.

Figure 27:
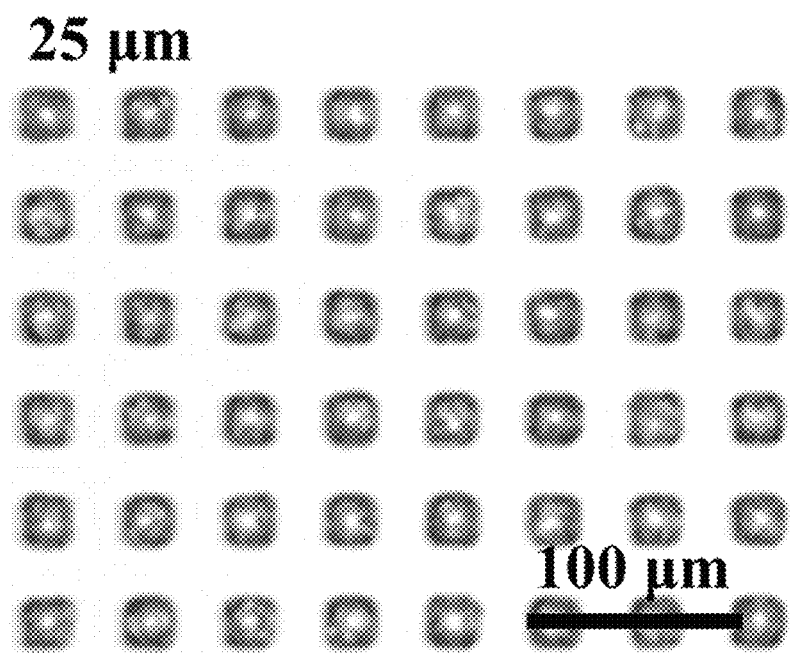
FIG. 27 is a photograph of a microstructure array according to Example 10.

The results are shown in FIGS. 23, 26, and 27.

FIG. 23 is a photograph of a microstructure array according to Example 3, FIG. 26 is a photograph of a microstructure array according to Example 9, and FIG. 27 is a photograph of a microstructure array according to Example 10.

Referring to FIGS. 23, 26, and 27, the microstructure arrays according to Examples are formed to have substantially equivalent shapes and dimensions to those of a concave micro pattern. Accordingly, a microstructure array having a desired shape and dimension may be surely obtained by using a mold having a concave micro pattern.
Evaluation IV The microstructure arrays according to Examples 3, 11, 12, 13 and Comparative Examples 1 to 4 are evaluated.

The results are shown in FIGS. 28 to 31.

Figure 28A:
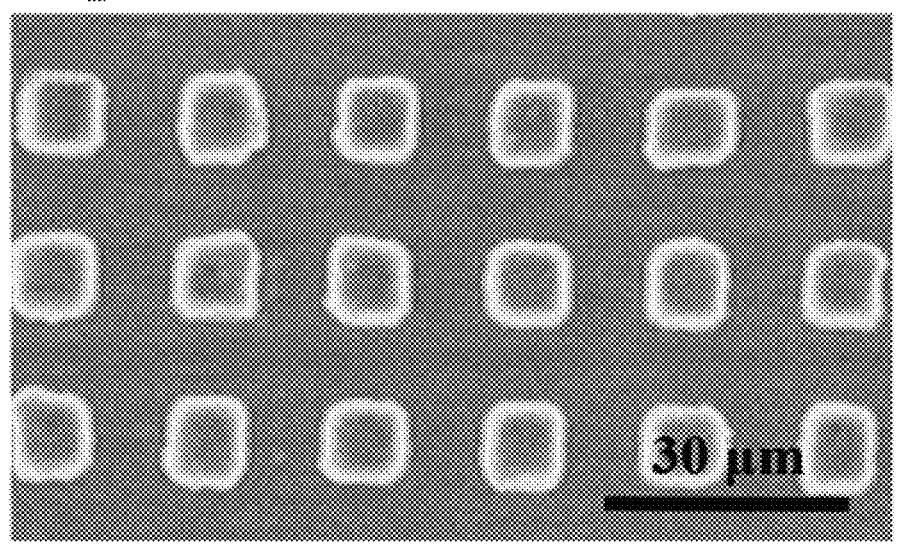
FIG. 28A is a photograph of a microstructure array according to Example 3.
Figure 28B:
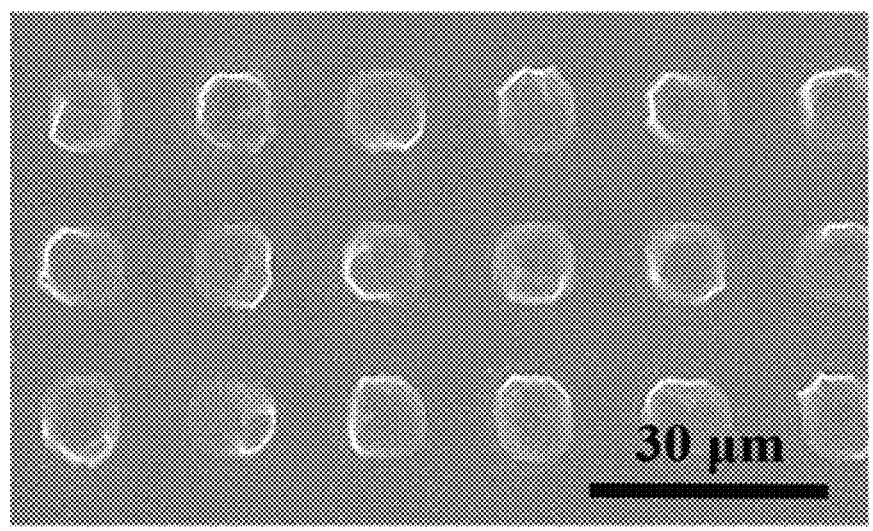
FIG. 28B is a photograph of a microstructure array according to Comparative Example 1.
Figure 29A:
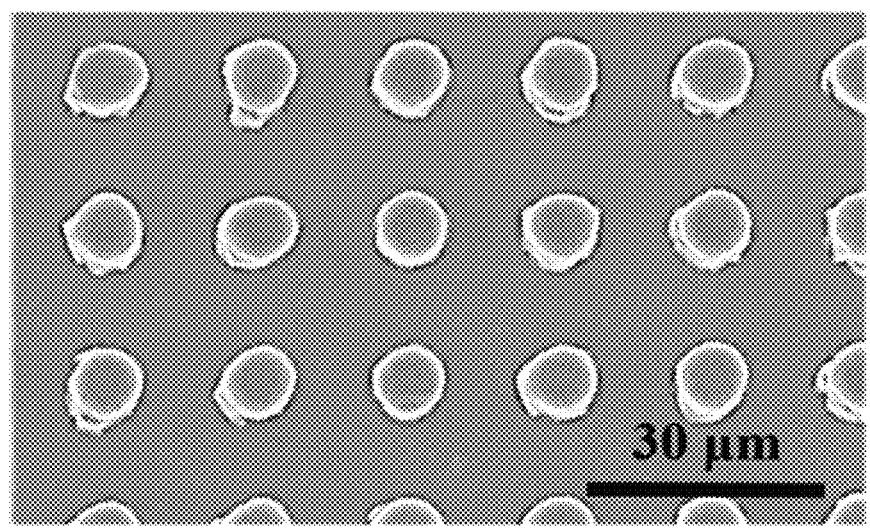
FIG. 29A is a photograph of a microstructure array according to Example 11.
Figure 29B:
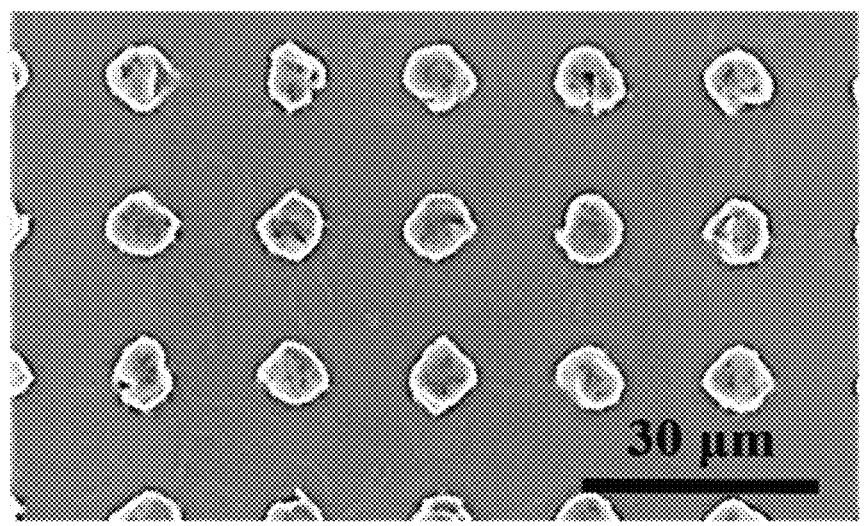
FIG. 29B is a photograph of a microstructure array according to Comparative Example 2.
Figure 30A:
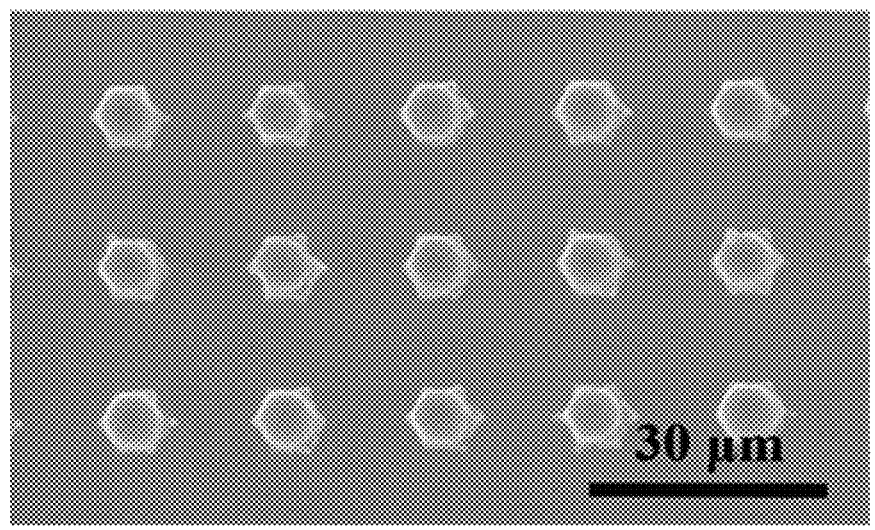
FIG. 30A is a photograph of a microstructure array according to Example 12.
Figure 30B:
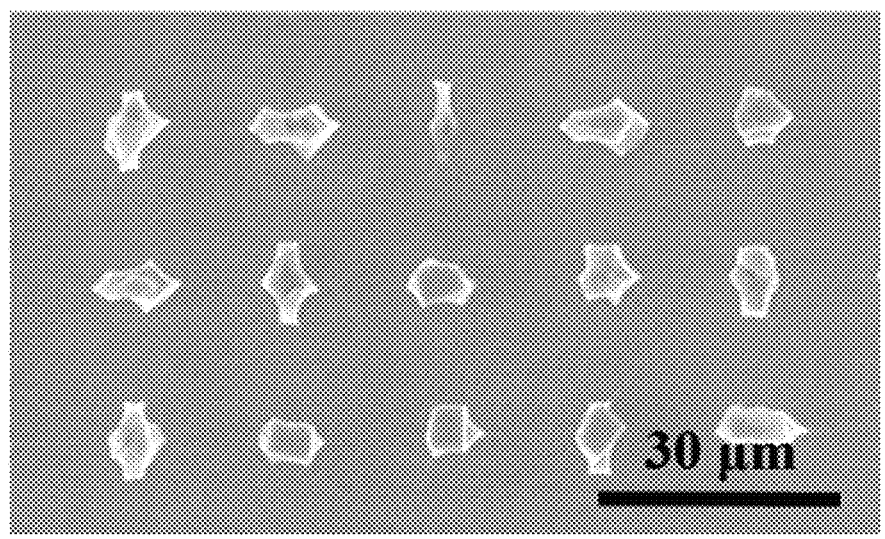
FIG. 30B is a photograph of a microstructure array according to Comparative Example 3.
Figure 31A:
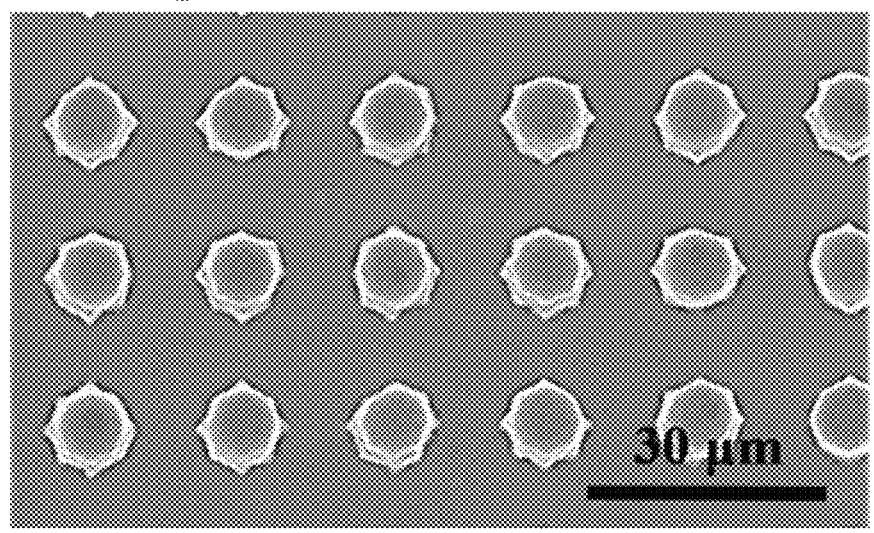
FIG. 31A is a photograph of a microstructure array according to Example 13.
Figure 31B:
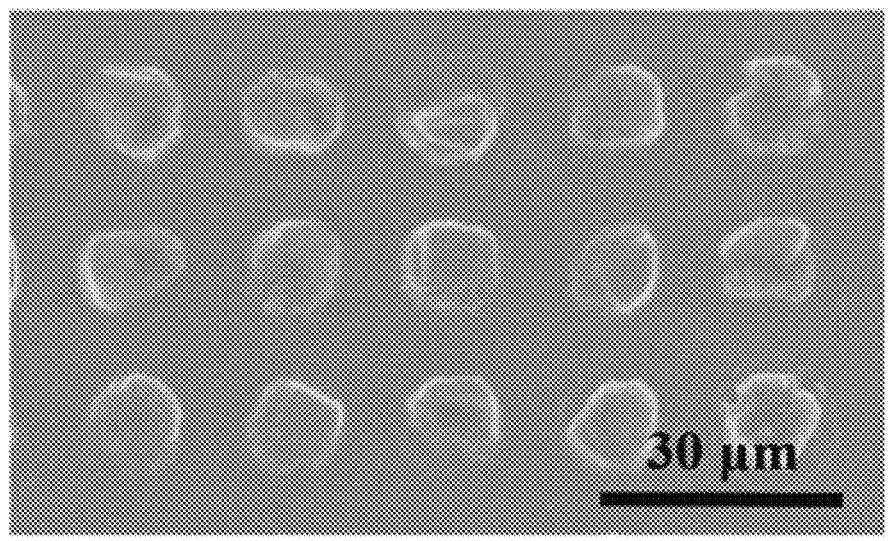
FIG. 31B is a photograph of a microstructure array according to Comparative Example 4.

FIG. 28A is a photograph of a microstructure array according to Example 3, FIG. 28B is a photograph of a microstructure array according to Comparative Example 1, FIG. 29A is a photograph of a microstructure array according to Example 11, FIG. 29B is a photograph of a microstructure array according to Comparative Example 2, FIG. 30A is a photograph of a microstructure array according to Example 12, FIG. 30B is a photograph of a microstructure array according to Comparative Example 3, FIG. 31A is a photograph of a microstructure array according to Example 13, and FIG. 31B is a photograph of a microstructure array according to Comparative Example 4.

Referring to FIGS. 28 to 31, the microstructure arrays according to Examples are formed to have similar shape and dimension as those of a concave micro pattern, compared with the microstructure arrays of comparative examples.
Evaluation V The microstructure array according to Example 6 is evaluated.

Figure 32:
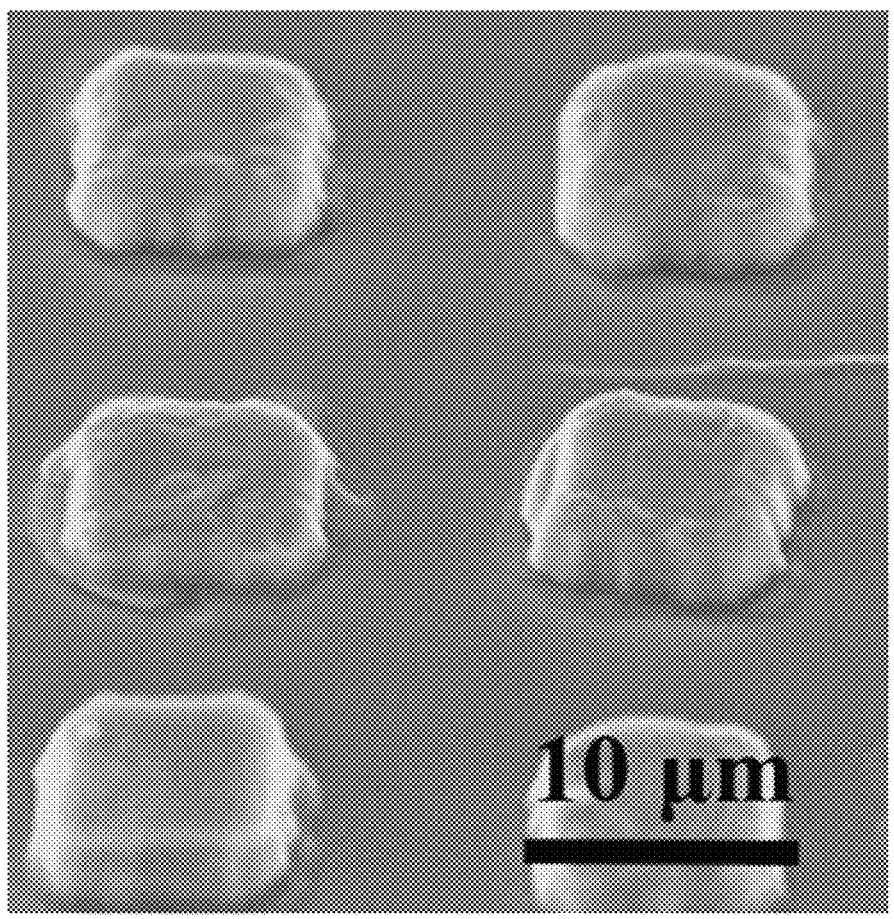
FIG. 32 is a photograph of a microstructure array according to Example 6.
Figure 33:
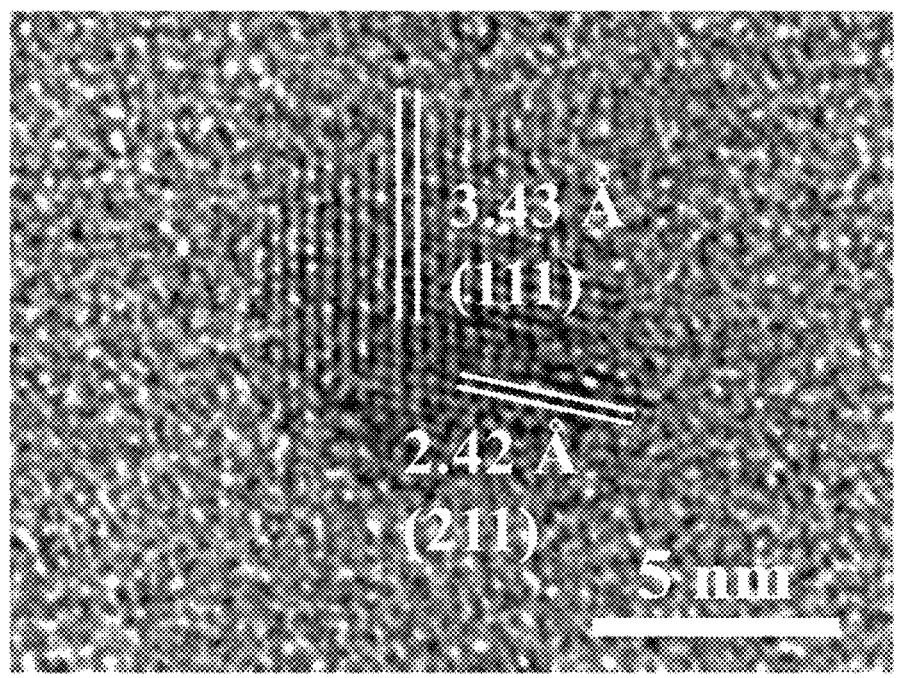
FIG. 33 shows a result of analyzing perovskite nanocrystals in the microstructure array of FIG. 32 using a transmission electron microscope (TEM)

FIG. 32 is a photograph of a microstructure array according to Example 6, and FIG. 33 shows a result of analyzing perovskite nanocrystals in the microstructure array of FIG. 32 using a transmission electron microscope TEM.

Referring to FIGS. 32 and 33, the microstructure array of Example 6 is formed to have a substantially equivalent shape and dimension to those of a concave micro pattern, wherein the perovskite nanocrystals have a crystal dimension of about 4.3 nm.
Evaluation VI Photoluminescence is confirmed by irradiating a He—Cd laser ($\lambda$=325 nm) to the microstructure arrays according to Examples 1 to 3 and Comparative Example 1.

The photoluminescence of the microstructure array is evaluated using a micro-photoluminescence system (Dongwoo Optron).

Figure 34:
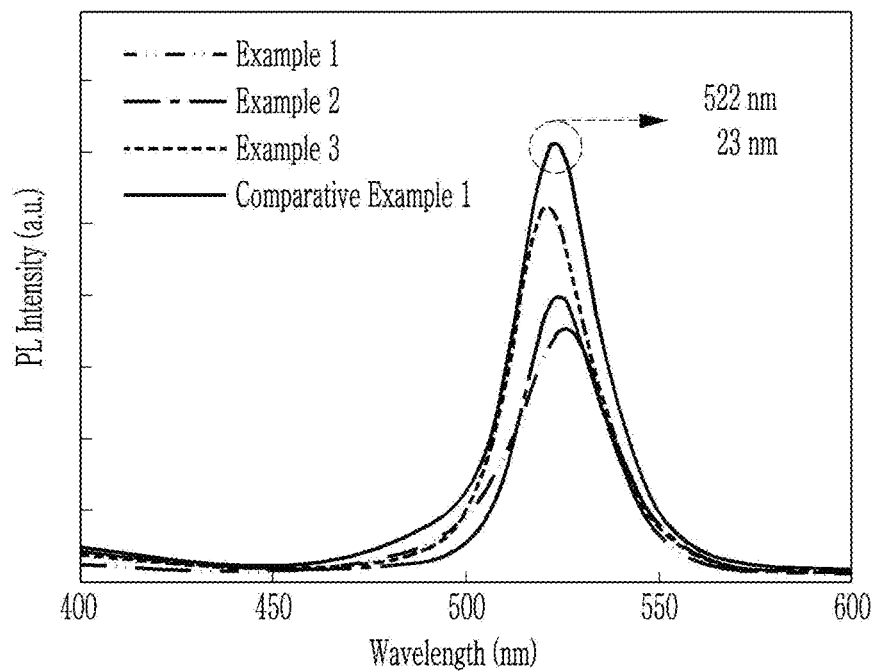
FIG. 34 shows emission spectra of the micro light emitting diodes according to Examples 1 to 3 and Comparative Example 1.

The results are shown in FIG. 34.

FIG. 34 shows emission spectra of the micro light emitting diodes according to Examples 1 to 3 and Comparative Example 1.

Referring to FIG. 34, the micro light emitting diodes of Examples 1 to 3 exhibit high emission intensity at a maximum light emitting wavelength, compared with the micro light emitting diode of Comparative Example 1.
Evaluation VII A glass substrate deposited with indium (In) is respectively made to contact the microstructure arrays of Examples 3, 11, 12, and 13 to manufacture micro light emitting diodes, and electroluminescence of the micro light emitting diodes is evaluated.

The electroluminescence of the microstructure arrays is evaluated using an electroluminescence measurement system (EL measurement system, Dongwoo Optron) and a BX-51 optical microscope (Olympus).

Figure 35:
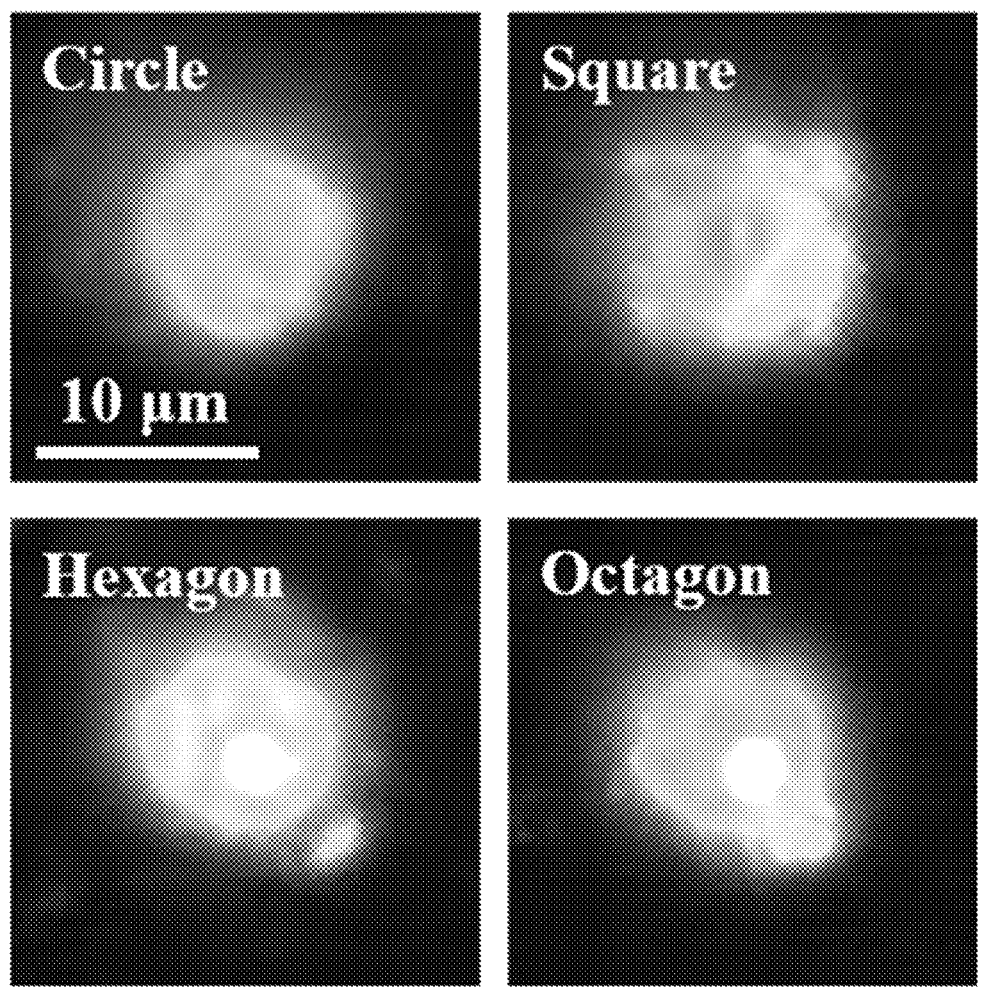
FIG. 35 is a photograph showing the light emission characteristics of one subpixel in the micro light emitting diodes according to Examples 3, 11, 12, and 13.
Figure 36:
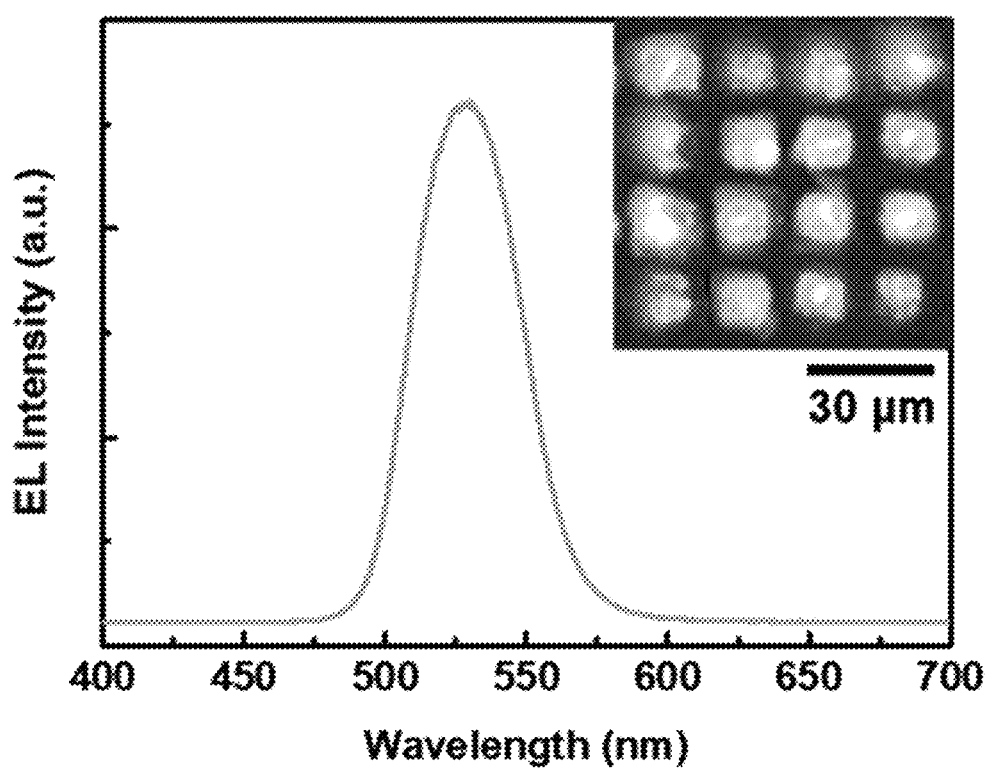
FIG. 36 is an emission spectrum of a micro light emitting diode according to Example 11.

The results are shown in FIGS. 35 and 36.

FIG. 35 is a photograph showing the light emission characteristics of one subpixel in the micro light emitting diodes according to Examples 3, 11, 12, and 13 and FIG. 36 is an emission spectrum of a micro light emitting diode according to Example 11.

Referring to FIGS. 35 and 36, the micro light emitting diodes of Examples are formed to have substantially equivalent microstructures (subpixels) to those of a concave micro pattern.

Evaluation VIII

The microstructure array (green) of Example 3, the microstructure array (red) of Example 7, and the microstructure array (blue) of Example 8 are respectively formed and then, irritated by a He—Cd laser ($\lambda$=325 nm) to examine photoluminescence.

The photoluminescence of the microstructure array is evaluated using a micro-photoluminescence system (Dongwoo Optron) and BX-51 optical microscope (Olympus).

Figure 37:
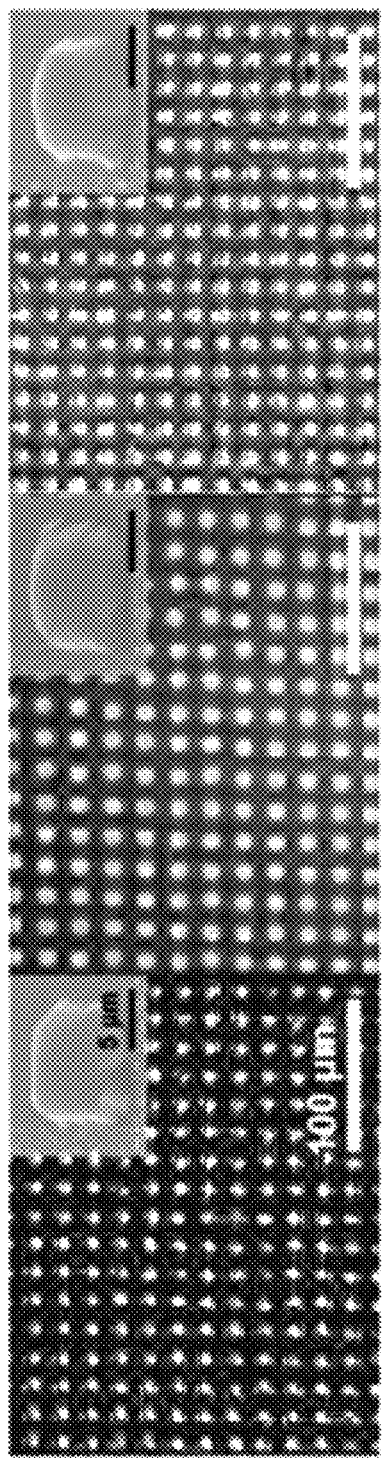
FIG. 37 shows light-emitting photographs of the microstructure arrays according to Examples 3, 7, and 8.
Figure 38:
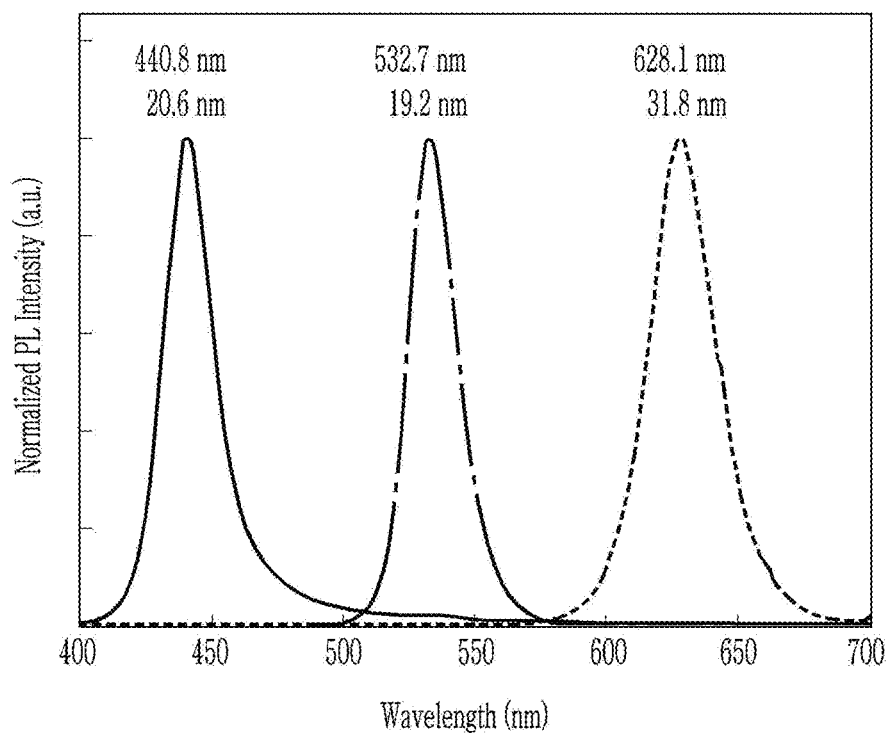
FIG. 38 shows emission spectra of an array of microstructures according to Examples 3, 7, and 8.

The results are shown in FIGS. 37 and 38 and Table 2.

FIG. 37 shows luminescence photographs of the microstructure arrays according to Examples 3, 7, and 8 and FIG. 38 shows light emission spectra of an array of microstructures according to Examples 3, 7, and 8.

TABLE 2

|  | Maximum emission wavelength ($\lambda_{max}$, nm) | Full width at half maximum (FWHM) (nm) |
|---|---|---|
| Example 3 | 532.7 | 19.2 |
| Example 7 | 628.1 | 31.8 |
| Example 8 | 440.8 | 20.6 |

Referring to FIGS. 37 and 38 and Table 2, the microstructure arrays of Examples 3, 7, and 8 respectively exhibit a narrow full width at half maximum (FWHM) in red, green, and blue wavelength regions and thus sufficient light emitting characteristics.

Evaluation IX

The microstructure arrays of Examples 3 and 6 and Comparative Example are respectively formed, a glass substrate deposited with indium (In) is respectively made to contact thereon to respectively manufacture micro light emitting diodes, and then, light emission stability depending on exposure time of the micro light emitting diodes in the air and light emission stability according to continuous dive under a predetermined voltage are evaluated.

The light emission stability of the microstructure arrays is evaluated by measuring light emitting characteristics with an electroluminescence (EL) measurement system, Dongwoo Optron Co., Ltd.) and a BX-51 optical microscope (Olympus Inc.) at 20° C. at 1 atm under relative humidity of 65%.

Figure 39:
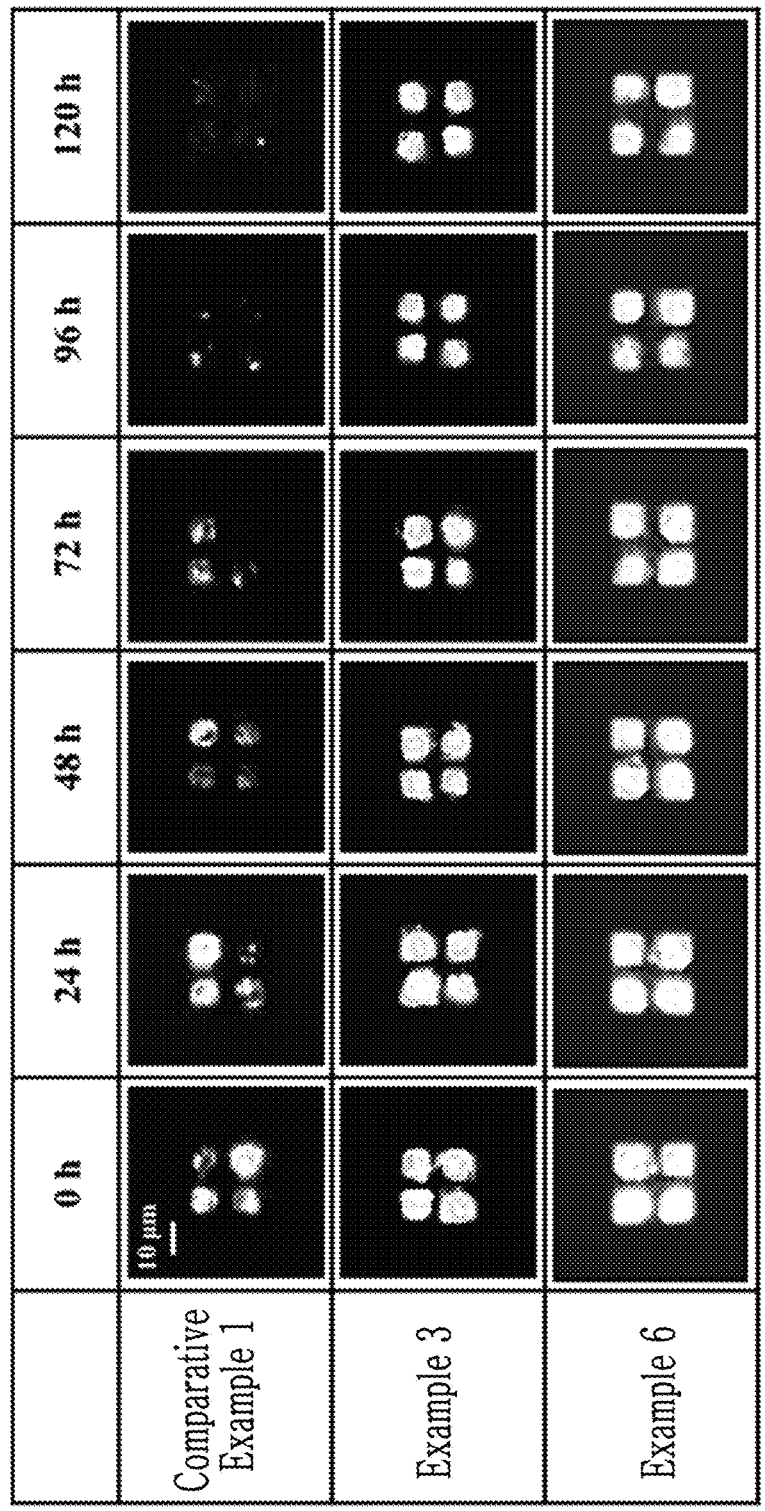
FIG. 39 is a photograph showing light emission stability according to exposure time in the air of the micro light emitting diodes according to Examples 3 and 6 and Comparative Example 1.
Figure 40:
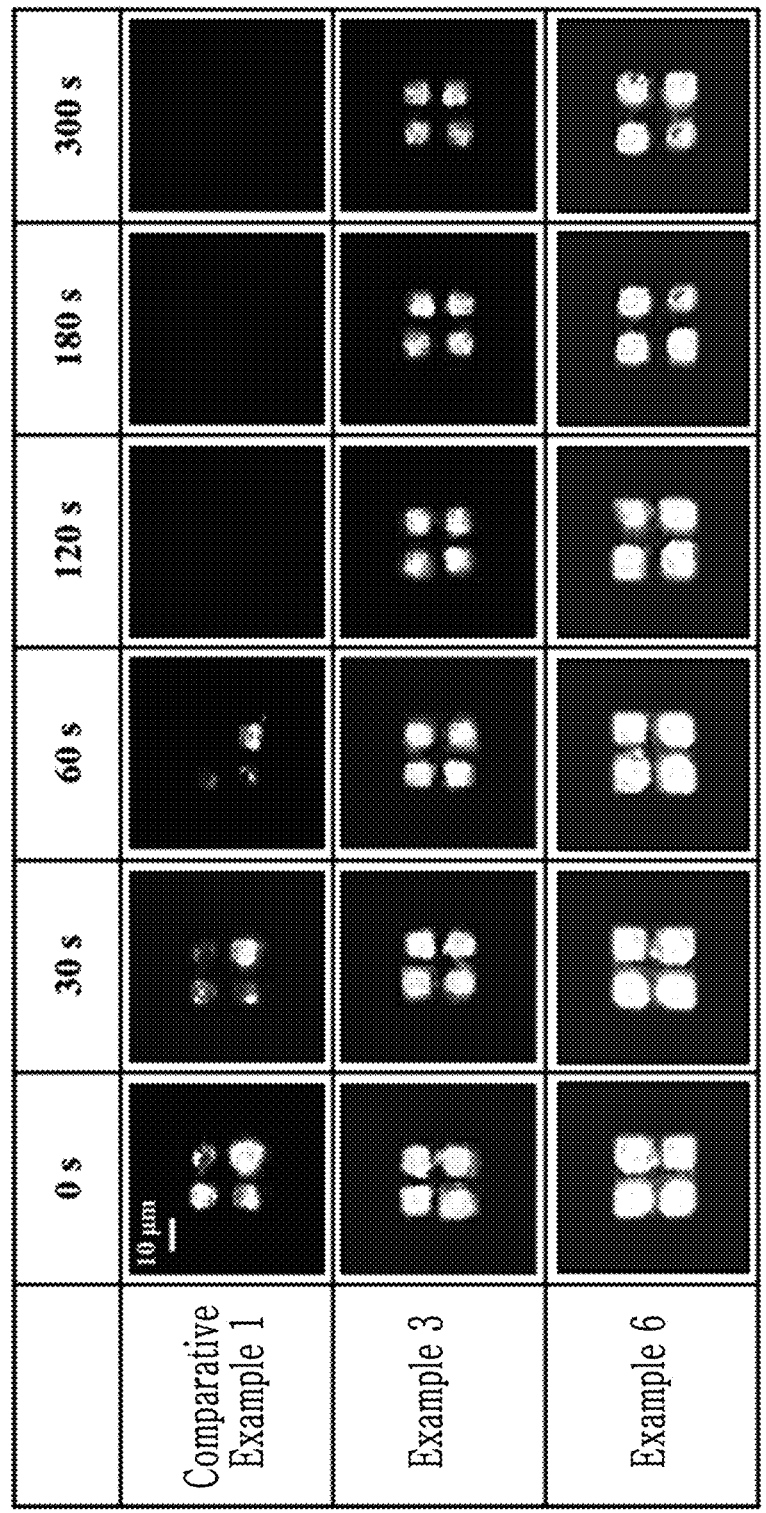
FIG. 40 is a photograph showing light emission stability according to continuous driving of the micro light emitting diodes according to Examples 3 and 6 and Comparative Example 1.

The results are shown in FIGS. 39 and 40.

FIG. 39 is a photograph showing light emission stability according to exposure time in the air of the micro light emitting diodes according to Examples 3 and 6 and Comparative Example 1 and FIG. 40 is a photograph showing light emission stability according to a continuous driving of the micro light emitting diodes according to Examples 3 and 6 and Comparative Example 1.

Referring to FIG. 39, the micro light emitting diodes of Examples exhibit excellent light emission stability depending on exposure time in the air compared with the micro light emitting diode of Comparative Example.

Referring to FIG. 40, the micro light emitting diodes of Examples exhibit excellent light emission stability according to the continuous drive compared with the micro light emitting diode of Comparative Example.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A method of manufacturing a microstructure array, comprising
preparing a mold having a concave micro pattern array in which a plurality of island-shaped concave micro patterns are arranged, each of the plurality of island-shaped concave micro patterns having an empty space,
preparing a perovskite precursor solution including a perovskite precursor, a ligand, and a hydrophilic polymer, the ligand being represented by RCOOH, RNH$_2$, R$_2$NH, R$_2$N, RSH, RH$_2$PO, R$_2$HPO, R$_3$PO, RH$_2$P, R$_2$HP, R$_3$P, ROH, RCOOR, RPO(OH)$_2$, RPOOH, RHPOOH, or R$_2$POOH wherein, R is independently a substituted or unsubstituted C1 to C40 aliphatic hydrocarbon, a substituted or unsubstituted C6 to C40 aromatic hydrocarbon, or a combination thereof,
coating the perovskite precursor solution on a substrate,
disposing the mold on the perovskite precursor solution to confine the perovskite precursor solution in each of the empty spaces of the plurality of island-shaped concave micro patterns,
obtaining a composite of perovskite nanocrystals, the ligand, and the hydrophilic polymer from the perovskite precursor solution in each of the empty spaces of the plurality of island-shaped concave micro patterns, the ligand being bound or coordinated to the surface of the perovskite nanocrystal, and
removing the mold to form a microstructure array in which a plurality of island-shaped microstructures including the composite of the perovskite nanocrystals, the ligand, and the hydrophilic polymer and seperated from each other are arranged.

2. The method of claim 1, wherein the hydrophilic polymer comprises polyvinylpyrrolidone, poly ethyleneamine, polyacrylamide, poly(meth)acrylate, polyvinyl alcohol, polyethylene glycol, polyethyleneoxide, polyoxazoline, a derivative thereof, or a copolymer thereof.

3. The method of claim 1, wherein the obtaining of the composite of the perovskite nanocrystals and the hydrophilic polymer comprises heat treatment.

4. The method of claim 3, wherein the heat treatment is performed at a temperature of about 50° C. to about 200° C.

5. The method of claim 1, wherein a dimension of the microstructure is equal to or smaller than a dimension of the concave micro pattern of the mold.

6. The method of claim 1, wherein a width and a length of the microstructure is less than or equal to about 80 μm, respectively.

7. A method of manufacturing a micro light emitting diode, comprising
forming a first electrode,
forming a microstructure array on the first electrode, and
forming a second electrode on the microstructure array,
wherein the forming of the microstructure array comprises
forming a first microstructure array in which a plurality of first microstructures including first perovskite nanocrystals configured to emit light in a first wavelength region are arranged, forming a second microstructure array in which a plurality of second microstructures including second perovskite nanocrystals configured to emit light in a second wavelength region are arranged, and forming a third microstructure array in which a plurality of third microstructures including third perovskite nanocrystals configured to emit light in a third wavelength region are arranged, and at least one of forming processes of the first, second, and third microstructure arrays is performed by the manufacturing method of the microstructure array of claim 1.

8. A microstructure array in which a plurality of island-shaped microstructures are arranged, wherein the plurality of island-shaped microstructures are seperated from each other, the plurality of island-shaped microstructures comprise a composite of perovskite nanocrystals, a ligand, and the hydrophilic polymer, the ligand being bound or coordinated to the surface of the perovskite nanocrystal, and the ligand is derived from RCOOH, $RNH_2$, $R_2NH$, $R_2N$, RSH, $RH_2PO$, $R_2HPO$, $R_3PO$, $RH_2P$, $R_2HP$, $R_3P$, ROH, RCOOR, $RPO(OH)_2$, RPOOH, RHPOOH, or $R_2POOH$ wherein, R is independently a substituted or unsubstituted C1 to C40 aliphatic hydrocarbon, a substituted or unsubstituted C6 to C40 aromatic hydrocarbon, or a combination thereof.

9. The microstructure array of claim 8, wherein the hydrophilic polymer comprises polyvinylpyrrolidone, polyethyleneamine, polyacrylamide, poly(meth)acrylate, polyvinyl alcohol, polyethylene glycol, polyethyleneoxide, polyoxazoline, a derivative thereof, or a copolymer thereof.

10. The microstructure array of claim 8, wherein an average crystal dimension of the perovskite nanocrystals is less than or equal to about 200 nm.

11. The microstructure array of claim 8, wherein a width and a length of the microstructures are less than or equal to about 80 μm, respectively.

12. A micro light emitting diode, comprising a first electrode and a second electrode facing each other, and the microstructure array of claim 8 disposed between the first electrode and the second electrode.

13. The micro light emitting diode of claim 12, wherein the microstructure array comprises a first microstructure array in which a plurality of first microstructures including a composite of first perovskite nanocrystals, a first ligand, and a first hydrophilic polymer are arranged, the first perovskite nanocrystals being configured to emit light in a first wavelength region, a second microstructure array in which a plurality of second microstructures including a composite of second perovskite nanocrystals, a second ligand, and a second hydrophilic polymer are arranged, the second perovskite nanocrystals being configured to emit light in a second wavelength region, and a third microstructure array in which a plurality of third microstructures including a composite of third perovskite nanocrystals, a third ligand, and a third hydrophilic polymer are arranged, the third perovskite nanocrystals being configured to emit light in a third wavelength region, wherein the first microstructures, the second microstructures, and the third microstructures may be disposed adjacently.

14. The micro light emitting diode of claim 13, wherein the micro light emitting diode comprises first, second, and third subpixels displaying different colors, wherein the first subpixel comprises the first microstructure, the second subpixel comprises the second microstructure, and the third subpixel comprises the third microstructure.

15. The micro light emitting diode of claim 12, further comprising a charge auxiliary layer disposed between at least one of the first electrode and the microstructure array and between the second electrode and the microstructure array.

16. A display device comprising the micro light emitting diode of claim 12.

* * * * *